United States Patent
Alben et al.

(10) Patent No.: US 11,669,421 B2
(45) Date of Patent: *Jun. 6, 2023

(54) FAULT INJECTION ARCHITECTURE FOR RESILIENT GPU COMPUTING

(71) Applicant: NVIDIA Corporation, Santa Clara, CA (US)

(72) Inventors: Jonah M. Alben, San Jose, CA (US); Sachin Satish Idgunji, San Jose, CA (US); Jue Wu, Los Gatos, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/591,481

(22) Filed: Feb. 2, 2022

(65) Prior Publication Data

US 2022/0156169 A1 May 19, 2022

Related U.S. Application Data

(63) Continuation of application No. 17/143,968, filed on Jan. 7, 2021, now Pat. No. 11,275,662, which is a
(Continued)

(51) Int. Cl.
*G06F 11/263* (2006.01)
*G06F 11/22* (2006.01)
(Continued)

(52) U.S. Cl.
CPC ........ *G06F 11/263* (2013.01); *G01R 31/3177* (2013.01); *G06F 1/10* (2013.01);
(Continued)

(58) Field of Classification Search
CPC . G06F 11/263; G06F 1/10; G06F 1/12; G06F 11/2236; G01R 31/3177; G06T 1/20; G11C 11/409; H03K 3/037
See application file for complete search history.

(56) References Cited

U.S. PATENT DOCUMENTS 3,784,801 A * 1/1974 Caputo .............. H04Q 3/54591
714/15
3,848,262 A * 11/1974 Belcastro ................ G11B 5/09
714/E11.018
(Continued)

FOREIGN PATENT DOCUMENTS

EP 0388526 B1 1/1996
WO 2015107611 A1 7/2015

OTHER PUBLICATIONS

Fang et al., "A Systematic Methodology for Evaluating the Error Resilience of GPGPU Applications," Preprint, IEEE Transactions on Parallel and Distributed Systems, vol. 27, No. 12, Mar. 7, 2016, pp. 3397-3411.
(Continued)

*Primary Examiner* — Charles L Beard
(74) *Attorney, Agent, or Firm* — Leydig, Voit & Mayer, Ltd.

(57) ABSTRACT

Unavoidable physical phenomena, such as an alpha particle strikes, can cause soft errors in integrated circuits. Materials that emit alpha particles are ubiquitous, and higher energy cosmic particles penetrate the atmosphere and also cause soft errors. Some soft errors have no consequence, but others can cause an integrated circuit to malfunction. In some applications (e.g. driverless cars), proper operation of integrated circuits is critical to human life and safety. To minimize or eliminate the likelihood of a soft error becoming a serious malfunction, detailed assessment of individual potential soft errors and subsequent processor behavior is necessary. Embodiments of the present disclosure facilitate emulating a plurality of different, specific soft errors. Resilience may be assessed over the plurality of soft errors and application code may be advantageously engineered to improve resilience. Normal processor execution is halted to
(Continued)

inject a given state error through a scan chain, and execution is subsequently resumed.

20 Claims, 15 Drawing Sheets

Related U.S. Application Data continuation of application No. 16/138,747, filed on Sep. 21, 2018, now Pat. No. 10,922,203.

(51) Int. Cl.

| | |
|---|---|
| *G01R 31/3177* | (2006.01) |
| *G06F 1/12* | (2006.01) |
| *G06T 1/20* | (2006.01) |
| *G06F 1/10* | (2006.01) |
| *G11C 11/409* | (2006.01) |
| *H03K 3/037* | (2006.01) |

(52) U.S. Cl.
CPC ............ *G06F 1/12* (2013.01); *G06F 11/2236* (2013.01); *G06T 1/20* (2013.01); *G11C 11/409* (2013.01); *H03K 3/037* (2013.01)

(56) References Cited

U.S. PATENT DOCUMENTS

| | | | | |
|---|---|---|---|---|
| 3,988,714 A * | 10/1976 | Bardotti | ............. | G06F 11/0745 714/E11.053 |
| 4,181,940 A * | 1/1980 | Underwood | .......... | G06F 11/277 714/25 |
| 4,503,535 A * | 3/1985 | Budde | ................. | G06F 11/0784 714/3 |
| 4,866,712 A * | 9/1989 | Chao | ................... | G06F 11/0706 714/704 |
| 4,964,126 A * | 10/1990 | Musicus | ................. | G06F 11/16 714/E11.054 |
| 4,996,687 A * | 2/1991 | Hess | ..................... | G06F 11/141 714/15 |
| 4,999,837 A * | 3/1991 | Reynolds | ............ | G06F 11/2215 714/10 |
| 5,008,885 A * | 4/1991 | Huang | ................. | G06F 11/261 714/704 |
| 5,046,068 A * | 9/1991 | Kubo | ................. | G06F 11/2736 714/25 |
| 5,153,881 A * | 10/1992 | Bruckert | ............... | G06F 11/165 714/10 |
| 5,193,181 A * | 3/1993 | Barlow | ............... | G06F 11/0793 714/2 |
| 5,269,016 A * | 12/1993 | Butler | ..................... | G06F 11/00 714/2 |
| 5,325,517 A * | 6/1994 | Baker | ................. | G06F 11/1641 714/E11.015 |
| 5,428,624 A * | 6/1995 | Blair | ............. | G01R 31/318547 714/E11.167 |
| 5,450,573 A * | 9/1995 | Gronemeyer | ....... | G06F 11/0724 713/375 |
| 5,872,910 A * | 2/1999 | Kuslak | ................ | G06F 11/2236 714/E11.166 |
| 5,943,490 A * | 8/1999 | Sample | ............. | G01R 31/3185 714/E11.155 |
| 5,960,191 A * | 9/1999 | Sample | ............ | G01R 31/31717 703/23 |
| 6,147,663 A * | 11/2000 | Smith | ................... | A63F 13/352 463/43 |
| 6,205,567 B1 * | 3/2001 | Maruyama | ............ | G06F 11/261 714/E11.167 |
| 6,282,587 B1 * | 8/2001 | Priem | .................. | G06F 13/28 710/33 |
| 6,442,722 B1 * | 8/2002 | Nadeau-Dostie | ............................ | G01R 31/31858 714/731 |
| 6,484,276 B1 * | 11/2002 | Singh | .................... | G06F 11/263 714/38.14 |
| 6,536,008 B1 * | 3/2003 | Nadeau-Dostie | ............................ | G01R 31/318583 714/726 |
| 6,560,720 B1 * | 5/2003 | Chirashnya | ........... | G06F 11/277 714/E11.175 |
| 6,647,516 B1 * | 11/2003 | Rust | ...................... | G06F 11/004 714/48 |
| 6,728,668 B1 * | 4/2004 | Kitamorn | .............. | G06F 11/261 703/22 |
| 6,751,756 B1 * | 6/2004 | Hartnett | ................. | G11C 29/02 714/49 |
| 6,886,116 B1 * | 4/2005 | MacLellan | .......... | G06F 11/2215 714/48 |
| 7,020,803 B2 * | 3/2006 | Wolin | ................. | G06F 11/2215 714/25 |
| 7,284,159 B2 * | 10/2007 | Chakraborty | .. | G01R 31/318541 714/41 |
| 7,320,114 B1 * | 1/2008 | Jain | ....................... | G06F 11/263 716/139 |
| 7,404,107 B2 * | 7/2008 | Burk | ..................... | G06F 11/263 714/41 |
| 7,444,551 B1 * | 10/2008 | Johnson | .............. | G06F 11/0766 714/41 |
| 7,467,289 B1 * | 12/2008 | Garlick | ................... | G06F 9/485 712/228 |
| 7,472,051 B2 * | 12/2008 | Mariani | .................. | G06F 11/27 714/E11.169 |
| 7,493,434 B1 * | 2/2009 | Abramovici | ... | G01R 31/318533 710/118 |
| 7,496,788 B1 * | 2/2009 | Alfieri | ................. | G06F 11/0751 714/21 |
| 7,512,773 B1 * | 3/2009 | Shebanow | ............. | G06F 9/485 712/228 |
| 7,536,605 B2 | 5/2009 | Keaffaber et al. | | |
| 7,555,692 B1 * | 6/2009 | Iacobovici | .......... | G06F 11/0751 708/233 |
| 7,600,155 B1 * | 10/2009 | Nickolls | ................. | G06F 11/36 714/38.13 |
| 7,627,787 B1 | 12/2009 | Johnson et al. | | |
| 7,669,095 B2 | 2/2010 | Clark et al. | | |
| 7,711,990 B1 * | 5/2010 | Nickolls | ............. | G06F 11/3648 714/37 |
| 7,739,556 B1 * | 6/2010 | Duluk, Jr. | ........... | G06F 11/0715 714/49 |
| 7,765,186 B1 * | 7/2010 | Hu | ........................ | G06F 16/273 707/704 |
| 7,779,238 B2 * | 8/2010 | Kosche | ................ | G06F 11/3447 717/130 |
| 7,802,147 B1 | 9/2010 | Johnson et al. | | |
| 7,827,445 B2 | 11/2010 | Foster, Sr. et al. | | |
| 7,983,893 B2 | 7/2011 | Durand et al. | | |
| 8,046,639 B1 * | 10/2011 | Nordin | ................ | G06F 11/2268 714/33 |
| 8,095,829 B1 * | 1/2012 | Coon | .................... | G06F 11/0715 714/38.1 |
| 8,127,181 B1 * | 2/2012 | Shebanow | .......... | G06F 11/3648 714/49 |
| 8,176,355 B2 * | 5/2012 | Crowell | ............. | G06F 11/2736 714/2 |
| 8,181,100 B1 * | 5/2012 | Purdham | ................ | G11C 29/42 714/819 |
| 8,301,980 B2 | 10/2012 | Gruner et al. | | |
| 8,321,495 B2 * | 11/2012 | Bailey | ................... | G06F 11/004 709/202 |
| 8,365,015 B1 * | 1/2013 | Yu | ......................... | G06F 9/3863 714/17 |
| 8,386,834 B1 * | 2/2013 | Goel | ..................... | G06F 11/108 714/6.22 |
| 8,473,273 B2 | 6/2013 | Durand et al. | | |
| 8,516,303 B2 * | 8/2013 | Gomyo | .................. | G06F 11/1405 714/48 |
| 8,572,573 B2 | 10/2013 | Baliga et al. | | |
| 8,640,114 B2 * | 1/2014 | Kosche | ................ | G06F 11/3447 717/158 |

(56) References Cited

U.S. PATENT DOCUMENTS

| | | | |
|---|---|---|---|
| 8,645,766 B2 | 2/2014 | Masser et al. | |
| 8,645,797 B2* | 2/2014 | Yigzaw | G06F 11/2236 714/41 |
| 8,650,447 B1 | 2/2014 | Wortman et al. | |
| 8,689,206 B2 | 4/2014 | Dow et al. | |
| 8,690,325 B1* | 4/2014 | Straus | A61B 5/0002 351/200 |
| 8,752,027 B2 | 6/2014 | Noureddine et al. | |
| 8,762,951 B1* | 6/2014 | Kosche | G06F 11/3476 717/127 |
| 8,813,055 B2* | 8/2014 | Kosche | G06F 11/3612 717/130 |
| 8,863,094 B2 | 10/2014 | Song | |
| 8,886,994 B2* | 11/2014 | Czajkowski | G06F 11/165 714/11 |
| 8,954,797 B2* | 2/2015 | Busaba | G06F 11/1428 714/16 |
| 8,954,806 B2* | 2/2015 | Dan | G11C 29/10 714/41 |
| 8,954,807 B2* | 2/2015 | Ma | G06F 11/3688 714/41 |
| 8,984,372 B2* | 3/2015 | Gandhi | G06F 11/10 714/824 |
| 8,997,039 B2* | 3/2015 | Andrade | G06F 11/3612 717/124 |
| 9,053,216 B1* | 6/2015 | Coleman | G06F 11/079 |
| 9,063,906 B2 | 6/2015 | Busaba et al. | |
| 9,092,312 B2 | 7/2015 | Meaney et al. | |
| 9,208,043 B1 | 12/2015 | Tseng et al. | |
| 9,208,064 B2 | 12/2015 | Frÿc et al. | |
| 9,264,021 B1* | 2/2016 | Jarrar | G06F 11/1608 |
| 9,275,429 B2* | 3/2016 | Alla | G06F 9/445 |
| 9,368,169 B2* | 6/2016 | Malladi | G11C 7/1072 |
| 9,389,977 B2* | 7/2016 | Jang | G06F 11/263 |
| 9,407,715 B2* | 8/2016 | Parmar | H04L 69/40 |
| 9,424,150 B2* | 8/2016 | Jerzak | G06F 11/2035 |
| 9,448,895 B2* | 9/2016 | North | G06F 11/1464 |
| 9,459,997 B2 | 10/2016 | Curley et al. | |
| 9,529,653 B2* | 12/2016 | Bose | G06F 11/073 |
| 9,588,845 B2* | 3/2017 | Henry | G06F 9/30014 |
| 9,607,714 B2* | 3/2017 | Malladi | G11C 29/023 |
| 9,639,474 B2 | 5/2017 | Duluk, Jr. et al. | |
| 9,678,816 B2* | 6/2017 | Rugina | G06F 11/0793 |
| 9,690,736 B2* | 6/2017 | Ma | G06F 13/4027 |
| 9,823,745 B1* | 11/2017 | Fateh | G06T 11/206 |
| 9,823,964 B2 | 11/2017 | Reed et al. | |
| 9,824,772 B2* | 11/2017 | Malladi | G11C 29/028 |
| 9,830,224 B2* | 11/2017 | Giroux | G06F 11/141 |
| 9,891,917 B2 | 2/2018 | Hastie et al. | |
| 9,928,128 B2* | 3/2018 | Barrick | G06F 9/3861 |
| 10,049,006 B2* | 8/2018 | Reed | G06F 3/0619 |
| 10,062,429 B1* | 8/2018 | Borole | G06F 12/1027 |
| 10,162,005 B1* | 12/2018 | Alzheimer | G01R 31/318547 |
| 10,168,879 B1* | 1/2019 | Duan | G06T 11/203 |
| 10,216,521 B2 | 2/2019 | Shirvani et al. | |
| 10,235,254 B2* | 3/2019 | Fukuda | G06F 11/203 |
| 10,248,488 B2* | 4/2019 | Ould-Ahmed-Vall | G06F 11/0772 |
| 10,248,521 B2 | 4/2019 | Catherwood et al. | |
| 10,267,677 B1* | 4/2019 | Sarkar | G01J 1/4204 |
| 10,324,816 B2* | 6/2019 | Barak | G06F 30/20 |
| 10,409,730 B2* | 9/2019 | Buschardt | G06F 12/1009 |
| 10,430,356 B2 | 10/2019 | Rashid et al. | |
| 10,437,637 B1* | 10/2019 | Koneru | G06F 8/44 |
| 10,452,797 B2* | 10/2019 | Smith | G06F 30/33 |
| 10,473,934 B2 | 11/2019 | Samec et al. | |
| 10,489,520 B2 | 11/2019 | Cho et al. | |
| 10,691,572 B2 | 6/2020 | Bramley et al. | |
| 10,747,926 B2* | 8/2020 | Xiang | G06F 30/3323 |
| 10,922,203 B1* | 2/2021 | Alben | G06T 1/20 |
| 10,997,043 B2 | 5/2021 | Kato et al. | |
| 11,099,974 B2 | 8/2021 | Sastry | |
| 11,301,350 B1* | 4/2022 | Byrne | G06F 11/263 |
| 11,495,315 B1* | 11/2022 | Zou | G11C 29/4401 |

| | | | |
|---|---|---|---|
| 2001/0044912 A1* | 11/2001 | Francis | G06F 11/0721 714/30 |
| 2002/0039325 A1* | 4/2002 | Aizawa | G11C 16/32 365/233.1 |
| 2002/0144175 A1* | 10/2002 | Long | G06F 11/181 714/11 |
| 2002/0152420 A1* | 10/2002 | Chaudhry | G06F 11/1641 714/11 |
| 2003/0061535 A1* | 3/2003 | Bickel | G06F 11/1675 714/E11.069 |
| 2004/0103328 A1* | 5/2004 | Ichien | G06F 1/3228 713/300 |
| 2004/0153756 A1* | 8/2004 | Tsukahara | G06F 11/1679 714/13 |
| 2004/0230861 A1* | 11/2004 | Bailey | G06F 11/0745 714/E11.023 |
| 2004/0255185 A1* | 12/2004 | Fujiyama | G06F 11/1482 714/E11.008 |
| 2005/0027970 A1* | 2/2005 | Arnold | G06F 9/383 712/E9.047 |
| 2005/0134800 A1* | 6/2005 | Kim | H04N 9/68 351/242 |
| 2005/0149781 A1* | 7/2005 | Lempel | G06F 12/0891 714/E11.023 |
| 2005/0188281 A1* | 8/2005 | Nguyen | G11C 29/02 714/42 |
| 2005/0261557 A1* | 11/2005 | Baker | A61B 5/4035 600/300 |
| 2006/0023633 A1* | 2/2006 | Caruk | G06F 1/3203 370/242 |
| 2006/0041814 A1* | 2/2006 | Rajski | G01R 31/318547 714/742 |
| 2006/0179207 A1* | 8/2006 | Eisen | G06F 11/1407 711/100 |
| 2006/0224906 A1* | 10/2006 | Habib | G06F 1/30 713/300 |
| 2006/0271825 A1* | 11/2006 | Keaffaber | G06F 11/3688 714/E11.207 |
| 2007/0022318 A1* | 1/2007 | Copenhaver | G06F 11/00 714/E11.018 |
| 2007/0168722 A1* | 7/2007 | de Almeida | G06F 11/1441 714/15 |
| 2007/0174679 A1 | 7/2007 | Chelstrom et al. | |
| 2008/0107361 A1* | 5/2008 | Asukai | A61B 3/113 382/317 |
| 2008/0115005 A1* | 5/2008 | Kamada | G06F 1/10 713/501 |
| 2008/0126766 A1* | 5/2008 | Chheda | G06F 9/3879 712/E9.067 |
| 2008/0126828 A1* | 5/2008 | Girouard | G06F 11/3644 714/E11.178 |
| 2008/0126830 A1* | 5/2008 | Balazich | G06F 11/0772 714/2 |
| 2008/0129839 A1 | 6/2008 | Asukai et al. | |
| 2008/0163255 A1* | 7/2008 | Munoz | G06F 11/2028 719/318 |
| 2008/0193011 A1 | 8/2008 | Hayashi et al. | |
| 2008/0270859 A1* | 10/2008 | Mikami | G01R 31/31858 714/E11.155 |
| 2009/0096807 A1* | 4/2009 | Silverstein | G06T 15/08 345/593 |
| 2009/0112204 A1* | 4/2009 | Aronow | A61B 18/1233 606/34 |
| 2009/0150732 A1* | 6/2009 | Jung | G06F 11/263 714/E11.159 |
| 2009/0164846 A1* | 6/2009 | Foster, Sr. | G11C 29/022 714/E11.02 |
| 2009/0177459 A1* | 7/2009 | Durand | G06F 11/0703 703/28 |
| 2009/0187741 A1* | 7/2009 | Greenhalgh | G06F 9/3816 712/213 |
| 2009/0240996 A1* | 9/2009 | Sasaya | G01R 31/318594 714/E11.155 |
| 2009/0249175 A1 | 10/2009 | Chandra et al. | |
| 2009/0259899 A1* | 10/2009 | Ludewig | G06F 11/0778 714/726 |

(56) References Cited

U.S. PATENT DOCUMENTS

| | | | |
|---|---|---|---|
| 2010/0005366 A1* | 1/2010 | Dell | G11C 29/70 714/764 |
| 2010/0049268 A1* | 2/2010 | Martins | G06F 11/2025 607/9 |
| 2010/0065349 A1* | 3/2010 | Ichikawa | B60L 53/18 307/29 |
| 2010/0088542 A1* | 4/2010 | Greb | G06F 11/0757 714/10 |
| 2010/0185838 A1* | 7/2010 | Chen | G06F 9/5027 712/E9.032 |
| 2010/0185909 A1* | 7/2010 | Li | G01R 31/318541 714/E11.155 |
| 2010/0245536 A1* | 9/2010 | Huitema | H04N 21/42203 348/E7.083 |
| 2010/0251017 A1 | 9/2010 | Yamada et al. | |
| 2010/0265820 A1* | 10/2010 | Feng | H04L 12/437 370/228 |
| 2011/0029191 A1* | 2/2011 | Macri | G05B 19/0428 340/425.5 |
| 2011/0047411 A1* | 2/2011 | Gille | G06F 11/073 711/E12.017 |
| 2011/0055646 A1* | 3/2011 | Mukherjee | G11C 29/56008 714/E11.169 |
| 2011/0055777 A1 | 3/2011 | Tremaine et al. | |
| 2011/0167310 A1* | 7/2011 | Tung | G01R 31/318538 714/E11.155 |
| 2012/0057785 A1* | 3/2012 | Morovic | H04N 1/6047 382/167 |
| 2012/0117419 A1* | 5/2012 | Hillman | G06F 11/0724 714/47.1 |
| 2012/0239993 A1* | 9/2012 | Chung | G01R 31/318547 714/E11.054 |
| 2012/0254698 A1* | 10/2012 | Ozer | G06F 11/106 714/764 |
| 2013/0007549 A1* | 1/2013 | Chan | G06F 11/261 714/E11.167 |
| 2013/0090745 A1* | 4/2013 | Frazer | G05B 19/054 700/12 |
| 2013/0151930 A1* | 6/2013 | Yigzaw | G06F 11/2236 714/768 |
| 2013/0212445 A1* | 8/2013 | Doerr | G01R 31/318552 714/E11.155 |
| 2013/0219238 A1* | 8/2013 | Tekumalla | G01R 31/318552 714/E11.155 |
| 2013/0275810 A1 | 10/2013 | Yigzaw et al. | |
| 2013/0304996 A1* | 11/2013 | Venkataraman | G06F 11/0751 711/150 |
| 2013/0318323 A1* | 11/2013 | Weissmann | G06F 12/1045 711/207 |
| 2013/0318535 A1* | 11/2013 | Sun | G06F 9/4887 718/104 |
| 2014/0019818 A1* | 1/2014 | Jindal | G06F 11/2215 714/724 |
| 2014/0025991 A1* | 1/2014 | Anandavally | G06F 11/16 714/E11.061 |
| 2014/0035650 A1* | 2/2014 | Zerbe | H03L 7/0995 327/299 |
| 2014/0063037 A1* | 3/2014 | Danielsson | G08G 5/0021 345/581 |
| 2014/0075244 A1* | 3/2014 | Takahashi | G06F 11/0736 714/38.1 |
| 2014/0089734 A1 | 3/2014 | Busaba et al. | |
| 2014/0097877 A1* | 4/2014 | Baeckler | G06F 1/12 327/158 |
| 2014/0181421 A1* | 6/2014 | O'Connor | G06F 9/50 711/148 |
| 2014/0189427 A1* | 7/2014 | Jayaprakash Bharadwaj | G06F 11/1415 714/15 |
| 2014/0239987 A1 | 8/2014 | Mayer et al. | |
| 2014/0258684 A1 | 9/2014 | Hastie et al. | |
| 2014/0281424 A1* | 9/2014 | Bobba | G06F 11/0715 712/225 |
| 2014/0344623 A1* | 11/2014 | Han | G06F 11/0751 714/37 |
| 2014/0351797 A1* | 11/2014 | Kalayci | G06F 11/3624 717/127 |
| 2014/0372823 A1* | 12/2014 | Dimri | G01R 31/318552 714/731 |
| 2014/0380085 A1* | 12/2014 | Rash | G06F 11/1415 714/49 |
| 2015/0021923 A1 | 1/2015 | Huang et al. | |
| 2015/0046677 A1* | 2/2015 | Moloney | G09G 5/363 712/29 |
| 2015/0067426 A1* | 3/2015 | Nardini | G01R 31/318385 714/727 |
| 2015/0074473 A1* | 3/2015 | Unesaki | G06F 11/2215 714/703 |
| 2015/0082001 A1* | 3/2015 | Duncan | G06F 12/1009 711/206 |
| 2015/0082101 A1* | 3/2015 | Lee | H03K 19/17764 714/57 |
| 2015/0089294 A1* | 3/2015 | Bell | G06F 11/0706 714/37 |
| 2015/0095699 A1* | 4/2015 | Shirano | G06F 11/1654 714/12 |
| 2015/0095721 A1* | 4/2015 | Beskrovny | G06F 11/3684 714/48 |
| 2015/0120009 A1* | 4/2015 | Killian | G05B 19/058 700/79 |
| 2015/0137862 A1* | 5/2015 | Bahl | G01R 31/318555 327/160 |
| 2015/0206272 A1* | 7/2015 | Perelygin | G06F 12/109 345/505 |
| 2015/0212923 A1* | 7/2015 | Sugiyama | G06F 11/3644 714/38.1 |
| 2015/0234693 A1 | 8/2015 | Palframan et al. | |
| 2015/0261593 A1* | 9/2015 | Bergmann | G06F 11/0787 714/57 |
| 2015/0270697 A1* | 9/2015 | Satheesh | H02H 3/105 361/102 |
| 2015/0286544 A1* | 10/2015 | Kadri | G06F 11/2033 714/13 |
| 2015/0318058 A1 | 11/2015 | Curley et al. | |
| 2015/0326155 A1* | 11/2015 | Mohammed | H02P 6/12 318/400.03 |
| 2015/0350580 A1* | 12/2015 | Sato | H04N 25/76 348/294 |
| 2015/0363252 A1* | 12/2015 | Singh | G06F 11/0766 714/57 |
| 2015/0378859 A1* | 12/2015 | Jang | G06F 11/3684 714/41 |
| 2016/0003907 A1* | 1/2016 | Rasjki | G01R 31/318547 714/738 |
| 2016/0085605 A1* | 3/2016 | Shimbo | G06F 11/008 714/704 |
| 2016/0098330 A1* | 4/2016 | Mu | G06F 3/0619 714/6.23 |
| 2016/0110274 A1* | 4/2016 | Ito | G06F 11/2236 714/41 |
| 2016/0179667 A1* | 6/2016 | Kumar | G06F 11/0778 711/135 |
| 2016/0224449 A1* | 8/2016 | Noyes | G06F 11/1076 |
| 2016/0240008 A1* | 8/2016 | Haddick | G02B 27/0093 |
| 2016/0246665 A1* | 8/2016 | Stolfo | G06F 11/3652 |
| 2016/0270656 A1* | 9/2016 | Samec | A61B 5/361 |
| 2016/0292059 A1 | 10/2016 | Catherwood et al. | |
| 2016/0334467 A1* | 11/2016 | Cho | G06F 30/00 |
| 2016/0334868 A1* | 11/2016 | Pacheco | G06F 3/013 |
| 2016/0360167 A1* | 12/2016 | Mitchell | H04N 9/3182 |
| 2017/0004647 A1* | 1/2017 | Grossman | G06T 1/20 |
| 2017/0025091 A1* | 1/2017 | Haddick | G09G 5/02 |
| 2017/0083422 A1 | 3/2017 | Cheng et al. | |
| 2017/0090940 A1* | 3/2017 | Gschwind | G06F 9/30185 |
| 2017/0103157 A1* | 4/2017 | Hutton | H03K 19/177 |
| 2017/0115338 A1 | 4/2017 | Chadalavda et al. | |
| 2017/0153791 A1* | 6/2017 | Kolli | G06F 3/04817 |
| 2017/0154480 A1* | 6/2017 | Takahashi | B60R 16/0231 |

(56) References Cited

U.S. PATENT DOCUMENTS

| | | | |
|---|---|---|---|
| 2017/0220774 A1* | 8/2017 | Orbach | G09B 7/00 |
| 2017/0242745 A1* | 8/2017 | Sherlock | G06F 11/1076 |
| 2017/0269807 A1* | 9/2017 | Nugent | G06F 3/04847 |
| 2017/0269871 A1* | 9/2017 | Khan | G06F 11/0769 |
| 2017/0293356 A1* | 10/2017 | Khaderi | G16H 50/20 |
| 2017/0308425 A1* | 10/2017 | Hicks | G06F 12/10 |
| 2017/0329623 A1* | 11/2017 | Dong | G06T 1/20 |
| 2017/0337664 A1* | 11/2017 | Grahn | G06T 7/49 |
| 2017/0338647 A1* | 11/2017 | Xiang | H02H 7/0858 |
| 2017/0344438 A1* | 11/2017 | Bilgiday | G06F 11/0784 |
| 2018/0059183 A1* | 3/2018 | Maeda | G01R 31/31922 |
| 2018/0129573 A1* | 5/2018 | Iturbe | G06F 11/1608 |
| 2018/0174664 A1* | 6/2018 | Byeon | G11C 29/42 |
| 2018/0174665 A1* | 6/2018 | Kraipak | G11C 29/36 |
| 2018/0182161 A1 | 6/2018 | Chaudhari et al. | |
| 2018/0197313 A1* | 7/2018 | Chakravorty | G06T 11/001 |
| 2018/0203713 A1* | 7/2018 | Elfering | G06F 9/4411 |
| 2018/0217204 A1* | 8/2018 | Huang | G11C 29/44 |
| 2018/0252768 A1* | 9/2018 | Rajski | G01R 31/31727 |
| 2018/0286105 A1* | 10/2018 | Surti | H04N 23/67 |
| 2018/0293122 A1* | 10/2018 | Craske | G06F 11/079 |
| 2018/0293780 A1* | 10/2018 | Maiyuran | G06F 1/329 |
| 2018/0299921 A1* | 10/2018 | Rajwani | G06F 13/161 |
| 2018/0300931 A1* | 10/2018 | Vembu | G06F 12/0813 |
| 2018/0302064 A1* | 10/2018 | Borole | H03K 3/012 |
| 2018/0304151 A1* | 10/2018 | Hicks | G09G 5/395 |
| 2018/0307485 A1* | 10/2018 | Appu | G06F 15/8007 |
| 2018/0307633 A1* | 10/2018 | Koker | G06F 13/42 |
| 2018/0308204 A1 | 10/2018 | Parikh et al. | |
| 2018/0308212 A1* | 10/2018 | Veernapu | G06T 1/20 |
| 2018/0314431 A1* | 11/2018 | Rashid | G06F 12/109 |
| 2018/0315398 A1* | 11/2018 | Kaul | G06N 3/08 |
| 2018/0321938 A1* | 11/2018 | Boswell | G06F 9/3012 |
| 2018/0331676 A1* | 11/2018 | Arp | G06F 1/10 |
| 2018/0348298 A1* | 12/2018 | Bhagwat | G01R 31/31723 |
| 2018/0349600 A1* | 12/2018 | Elenes | G06F 21/725 |
| 2018/0357001 A1* | 12/2018 | Scheer | G06F 12/02 |
| 2018/0365017 A1* | 12/2018 | Shirvani | G06F 9/3865 |
| 2019/0010227 A1 | 1/2019 | Sun | |
| 2019/0012222 A1* | 1/2019 | Sherlock | G06F 11/0754 |
| 2019/0033366 A1* | 1/2019 | Huang | G01R 31/318558 |
| 2019/0049914 A1* | 2/2019 | Munafo | G07C 5/0816 |
| 2019/0052280 A1* | 2/2019 | Perez | H03L 7/0995 |
| 2019/0065338 A1* | 2/2019 | Bramley | G06F 11/3419 |
| 2019/0079826 A1* | 3/2019 | Gianisis | G05B 9/03 |
| 2019/0102242 A1* | 4/2019 | Sullivan | G06F 9/3004 |
| 2019/0102271 A1* | 4/2019 | Matsukawa | G06F 11/1608 |
| 2019/0113572 A1* | 4/2019 | Bose | G01R 31/318357 |
| 2019/0121689 A1* | 4/2019 | Jeyapaul | G06F 3/0679 |
| 2019/0149485 A1* | 5/2019 | Shino | H03K 19/017509 370/412 |
| 2019/0163255 A1* | 5/2019 | Dewey | G06F 13/4221 |
| 2019/0187207 A1* | 6/2019 | Pillay | G06F 30/33 |
| 2019/0188391 A1* | 6/2019 | Margalit | G06F 21/577 |
| 2019/0205233 A1* | 7/2019 | Jung | G06F 11/263 |
| 2019/0220222 A1* | 7/2019 | Ware | G11C 7/22 |
| 2019/0220745 A1* | 7/2019 | Huang | G06N 3/08 |
| 2019/0220776 A1* | 7/2019 | Huang | G01R 31/318583 |
| 2019/0227121 A1* | 7/2019 | Azam | G06F 11/073 |
| 2019/0228831 A1* | 7/2019 | Bedarida | G11C 7/24 |
| 2019/0235940 A1* | 8/2019 | Kegel | G06V 10/764 |
| 2019/0235941 A1* | 8/2019 | Bath | G06F 11/0709 |
| 2019/0237151 A1* | 8/2019 | Cho | G11C 29/02 |
| 2019/0250210 A1* | 8/2019 | Sun | G01R 31/31724 |
| 2019/0286214 A1* | 9/2019 | Pabalkar | G06F 1/3228 |
| 2019/0286511 A1* | 9/2019 | Rol | B60W 50/02 |
| 2019/0294467 A1* | 9/2019 | Yamada | G06F 9/30036 |
| 2019/0303260 A1* | 10/2019 | Ozer | G06F 11/27 |
| 2019/0303300 A1* | 10/2019 | Boyd | G06F 12/08 |
| 2019/0339328 A1* | 11/2019 | Xiang | G01R 31/318328 |
| 2019/0348139 A1* | 11/2019 | Waldrop | G11C 29/42 |
| 2019/0361786 A1* | 11/2019 | Arai | G06F 9/30192 |
| 2020/0008862 A1 | 1/2020 | Le | |
| 2020/0064823 A1* | 2/2020 | Somercik | G05B 23/0264 |
| 2020/0073786 A1* | 3/2020 | Schat | G06F 11/3672 |
| 2020/0081785 A1* | 3/2020 | Chen | G06F 11/348 |
| 2020/0084437 A1* | 3/2020 | Feekes | G06F 11/0736 |
| 2020/0088862 A1* | 3/2020 | Lundberg | G06N 3/04 |
| 2020/0096569 A1* | 3/2020 | Mishaeli | G01R 31/318533 |
| 2020/0097209 A1* | 3/2020 | Zhou | G06F 3/064 |
| 2020/0132759 A1* | 4/2020 | Shen | G01R 31/31723 |
| 2020/0142795 A1* | 5/2020 | Kato | G06F 11/263 |
| 2020/0159635 A1* | 5/2020 | Song | G06F 11/2268 |
| 2020/0167223 A1* | 5/2020 | Cho | H03K 19/21 |
| 2020/0175157 A1* | 6/2020 | Wilding | G06F 8/60 |
| 2020/0183819 A1* | 6/2020 | Fiege | G06F 8/441 |
| 2020/0200820 A1* | 6/2020 | Strasser | G01R 31/318314 |
| 2020/0217259 A1* | 7/2020 | Ogawa | F02D 41/1401 |
| 2020/0218808 A1* | 7/2020 | Hershman | G06F 21/554 |
| 2020/0233030 A1* | 7/2020 | Flores | G01R 31/31703 |
| 2020/0241985 A1* | 7/2020 | Zhang | G06F 11/221 |
| 2020/0290533 A1* | 9/2020 | Dürkop | G06F 11/261 |
| 2020/0319987 A1* | 10/2020 | Yang | G06F 11/263 |
| 2021/0033669 A1* | 2/2021 | Cheng | G01R 31/3177 |
| 2021/0156918 A1* | 5/2021 | Mrugalski | G01R 31/318536 |
| 2021/0157699 A1* | 5/2021 | Alben | G06T 1/20 |
| 2021/0357299 A1 | 11/2021 | Wilson, Jr. | |
| 2022/0043062 A1* | 2/2022 | Cheng | G01R 31/318572 |
| 2022/0100599 A1* | 3/2022 | Abuelela | H04L 41/5019 |
| 2022/0100645 A1* | 3/2022 | Paterson-Jones | G06F 9/45558 |
| 2022/0138066 A1* | 5/2022 | Gaur | G11C 29/02 714/703 |

OTHER PUBLICATIONS

Previlon et al., "Evaluating the Impact of Execution Parameters on Program Vulnerability in GPU Applications," Preprint, Design, Automation & Test in Europe Conference and Exhibition, Apr. 23, 2018, pp. 809-814.

Tselonis et al., "GUFI: a Framework for GPUs Reliability Assessment," Preprint, 2016 IEEE International Symposium on Performance Analysis of Systems and Software (ISPASS), Jun. 2, 2016, pp. 90-100.

Li et al., "Software-based Dynamic Reliability Management for GPU Applications," Preprint, 2016 IEEE International Reliability Physics Symposium (IRPS), Sep. 26, 2016, 7 pp.

Tselonis et al., "The Functional and Performance Tolerance of GPUs to Permanent Faults in Registers," Preprint, 2013 IEEE 19th International On-Line Testing Symposium (IOLTS), Jul. 8-10, 2013, pp. 236-239.

Fang et al., "GPU-Qin: A Methodology for Evaluating the Error Resilience of GPGPU Applications," Preprint, 2014 IEEE International Symposium on Performance Analysis of Systems and Software (ISPASS), Jun. 26, 2014, 10 pp.

Yim et al., "Hauberk: Lightweight Silent Data Corruption Error Detector for GPGPU," Preprint, Parallel & Distributed Processing Symposium (IPDPS), 2011 IEEE International, Sep. 8, 2011, pp. 287-300.

Fang, "Error Resilience Evaluation on GPGPU Applications," Master of Software Systems, The University of British Columbia (Vancouver). A Thesis Submitted in Partial Fulfillment of the Requirements for the Degree of Master of Applied Science in the Faculty of Graduate and Postdoctoral Studies (Electrical and Computer Engineering), Aug. 2014, 72 pp.

\* cited by examiner

FAULT INJECTION ARCHITECTURE FOR RESILIENT GPU COMPUTING

CLAIM OF PRIORITY

This application is a continuation of U.S. Non-Provisional application Ser. No. 17/143,968 titled "Fault Injection Architecture For Resilient GPU Computing," filed Jan. 7, 2021, which is a continuation of U.S. Pat. No. 10,922,203 titled "Fault Injection Architecture For Resilient GPU Computing," filed Sep. 21, 2018, the entire contents of which is incorporated herein by reference.

FIELD OF THE INVENTION

The present invention relates to resiliency in processing units, and more particularly to a fault injection architecture for resilient graphics processing unit (GPU) computing.

BACKGROUND

Memory circuits including flip-flops, latches, and random access memory cells can exhibit a transient or "soft" error and provide an incorrect output value. For example, an alpha particle may strike a physical storage node of a flip-flop and cause the flip-flop to change state. If the flip-flop is part of a processing unit, the alpha particle strike on the flip-flop may or may not cause the processing unit to produce incorrect results. In some cases, the state of a particular memory circuit will not change the results, while in other cases erroneous state in the memory circuit can generate a problematic error. Whether an error is actually generated by the processing unit depends on which memory circuit was affected and at what point in program execution. Modern GPUs typically include many millions of memory circuits, each of which may experience a soft error. Characterizing the resilience of a GPU to soft errors conventionally involves subjecting an operating GPU die to ionizing radiation. However, such techniques offer little control over which memory circuits are affected or when a specific memory circuit is affected relative to program execution. Consequently, conventional techniques do not provide accurate assessment of resilience of a particular GPU executing a given application. Thus, there is a need for addressing these issues and/or other issues associated with the prior art.

SUMMARY

A method, processing unit, and system are disclosed for fault injection for assessing resilience in a multi-threaded processing unit. The method comprises executing a multi-threaded program, receiving a command to inject a state error within a specified subsystem of the processing unit, waiting for at least one halt condition to be satisfied, halting execution of the multi-threaded program within the subsystem, and injecting the state error. The state error is injected within the subsystem at a specified data storage circuit or at a specified random access memory (RAM) bit, before execution of the multi-threaded program is resumed. In an embodiment, the command is transmitted from a host processor to a programmable management unit within the processing unit through a host interface. In certain embodiments, the specified data storage circuit comprises one of a flip-flop or a latch.

DETAILED DESCRIPTION

Embodiments of the present disclosure provide precise state error injection into a processing unit, such as a GPU, executing an application. The application may execute in real-time and the process of injecting a state error may be generally transparent to the application. This capability of precise and transparent state error injection allows application developers to emulate any soft error in a GPU and confidently assess potential consequences of a resulting error in the application. Such assessment can be important for engineering reliable systems used in mission-critical applications, such as self-driving vehicle applications and others where a catastrophic system failure can impact human life and safety.

In an embodiment, circuitry within the GPU is organized into scan partitions, which may mirror scan chains used for production scan testing. Data storage circuits, such as flip-flops, latches, sequential circuits, or any other circuits that store state, are configured to form scan chains, which are coupled to a scan controller. Random access memory (RAM) circuits are coupled to a RAM access control circuit configured to provide read-modify-write access to the RAM circuits. A command to inject a state error in a GPU subsystem causes functional clock(s) used by the subsystem to be halted and the subsystem switched into a scan mode. All storage circuit state from the subsystem is scanned through an in-silicon fault injection (ISFI) circuit, which is able to inject a precise error (e.g., invert a state bit) at a specified location. Error injection within a RAM circuit may be accomplished by directing a RAM access control circuit to perform a read-modify-write operation that modifies a specified bit. After injecting a state error, the subsystem is restored to a functional mode. Except for the passage of additional time needed to perform the state error injection, the process is otherwise transparent to an application executing on the GPU subsystem and being subjected to a state error.

Figure 1A:
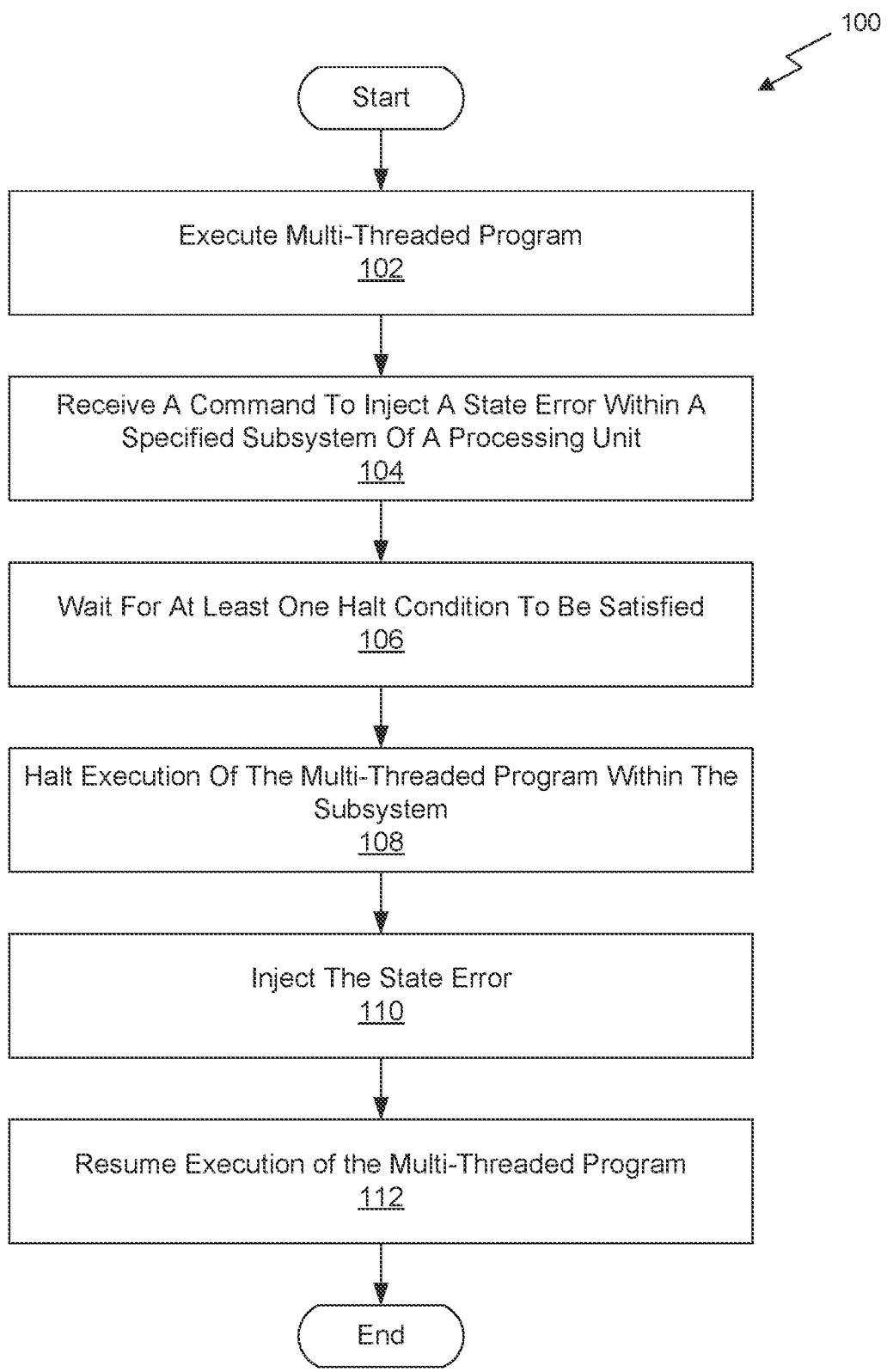
FIG. 1A illustrates a flowchart of a method for injecting a state error in a processing unit, in accordance with an embodiment.

FIG. 1A illustrates a flowchart of a method 100 for injecting a state error in a processing unit, in accordance with an embodiment. Although method 100 is described in the context of a processing unit, the method 100 may also be performed by a program executed by a processing unit, any custom circuitry, or by a combination of custom circuitry and a program. For example, the method 100 may be executed by circuitry within a GPU, circuitry within a CPU (central processing unit), or any other technically feasible processor, such as parallel processing unit (PPU) 300 of FIG. 3. Furthermore, persons of ordinary skill in the art will understand that any system that performs method 100 is within the scope and spirit of various embodiments. In an embodiment, method 100 is performed by a GPU device comprising an in-silicon fault injection (ISFI) circuit.

At step 102, the processing unit executes a multi-threaded program. The multi-threaded program may include, without limitation, a group of related threads, or multiple groups each comprising related threads. At step 104, the processing unit receives a command to inject a state error within a specified subsystem of the processing unit. At step 106, the processing unit waits for at least one halt condition to be satisfied.

In an embodiment, the at least one halt condition includes at least one of: an indication that asynchronous buffers configured to interface with the subsystem are inactive, an indication that a specified number of clock cycles have been counted, or an indication that a specified breakpoint instruction has been executed. For example, a halt condition may include waiting for pending operations for the asynchronous buffers to conclude, allowing the asynchronous buffers to become inactive. In another example, a halt condition may include the specified number of clock cycles has been counted and the asynchronous buffers are inactive. In yet another example, a break point instruction has been executed (or an instruction count reached) and the asynchronous buffers are inactive. Other halt conditions may also be implemented without departing the scope and spirit of various embodiments.

At step 108, the processing unit halts execution of the multi-threaded program within the subsystem. In various embodiments, the subsystem may include an arbitrarily large or small subset of circuitry within the processing unit. In an embodiment, the subsystem comprises one or more general processing clusters (GPCs) 350. At step 110, the processing unit injects the state error, wherein the state error is injected within the subsystem at a specified data storage circuit (e.g., flip-flop or latch), or at a specified random access memory (RAM) bit. The data storage circuit may be specified as a numbered location within a specified scan chain. The RAM bit may be specified as a bit position within an addressed word of a specified RAM instance. At step 112, the processing unit resumes execution of the multi-threaded program. In an embodiment, the command to inject the state error is transmitted from a host processor to a programmable management unit within the processing unit through a host interface.

In an embodiment, halting comprises synchronously disabling at least one functional clock signal for the subsystem, including the functional clock signal. Furthermore, resuming comprises synchronously enabling the at least one functional clock signal for the subsystem, including the functional clock signal. In various embodiments, a functional clock signal (e.g., functional clock signal 141 of FIG. 1B) is derived from a master functional clock signal and the functional clock signal is propagated through a clock buffer and/or clock distribution tree to clock endpoints within the subsystem. The clock endpoints provide synchronous clock signals for data storage circuits within the subsystem, including the specified data storage circuit. The clock endpoints may also provide synchronous clock signals for RAM circuits within the subsystem, including a RAM circuit instance in which the specified RAM bit resides.

In general, a synchronously derived run/halt signal may be used to cause a clock control circuit to either allow or not allow the master clock signal to propagate to the clock endpoints. However, any technically feasible technique or techniques may be implemented to synchronously disable and synchronously enable the functional clock signal without departing the scope and spirit of various embodiments.

More illustrative information will now be set forth regarding various optional architectures and features with which the foregoing framework may be implemented, per the desires of the user. It should be strongly noted that the following information is set forth for illustrative purposes and should not be construed as limiting in any manner. Any of the following features may be optionally incorporated with or without the exclusion of other features described.

Figure 1B:
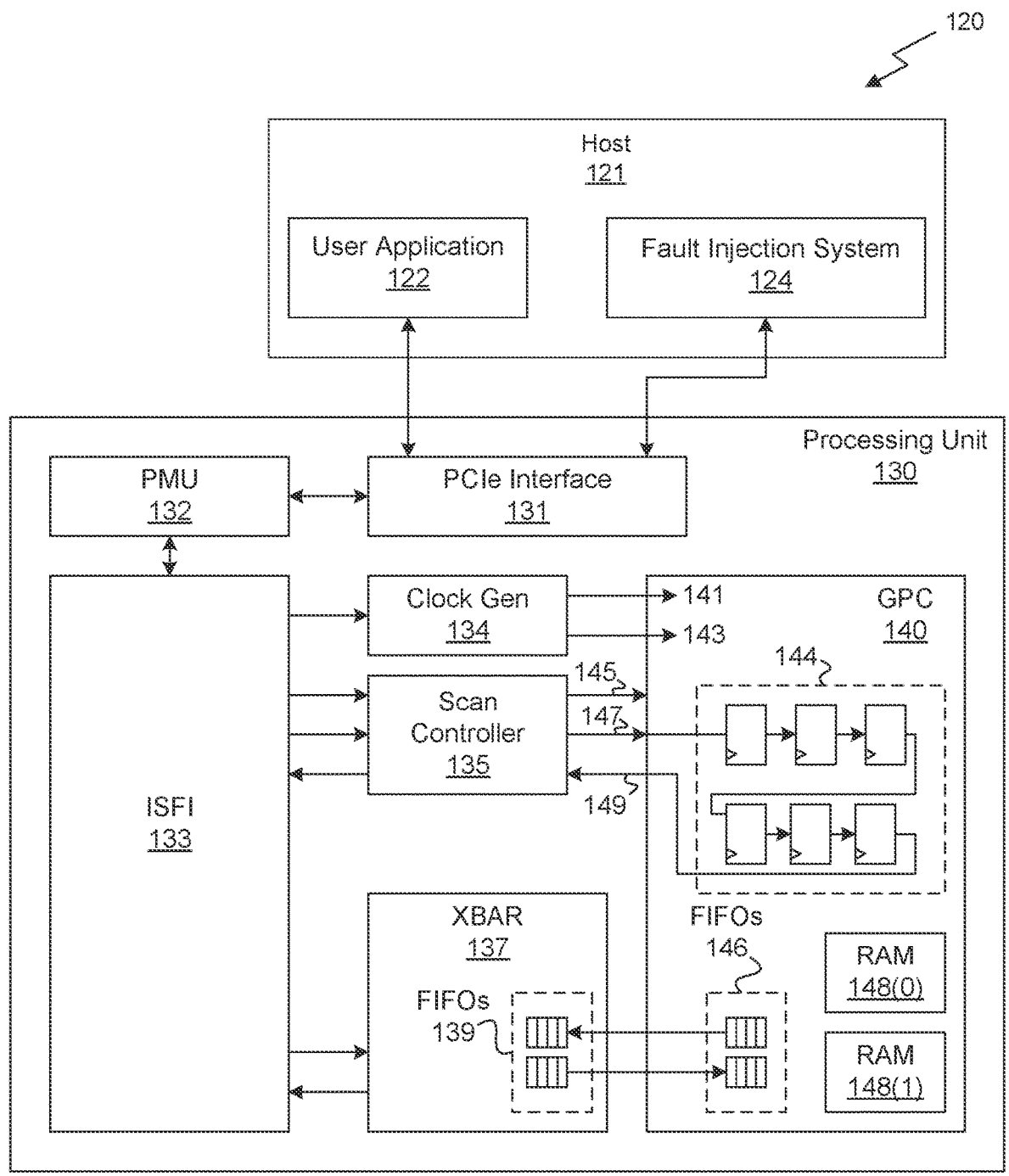
FIG. 1B illustrates a test system configured to provide state error injection in a processing unit, in accordance with an embodiment.

FIG. 1B illustrates a test system 120 configured to provide state error injection in a processing unit, in accordance with an embodiment. As shown, the test system 120 includes a host 121 coupled to a processing unit 130. The host 121 may be configured to execute a user application 122 that operates in conjunction with multi-threaded code executing on the processing unit 130. The user application 122 may be configured initiate and manage execution of the multi-threaded code. The host 121 may also be configured to execute a fault injection system 124 that directs the processing unit 130 to inject a state error in the circuitry of the processing unit 130. The state error may emulate an actual soft error due to physical phenomenon such as an alpha particle strike on a corresponding physical storage node.

Resilience of the multi-threaded code can be assessed with respect to the state error by monitoring subsequent execution state and/or execution outcomes of the multi-threaded code. In a practical usage model, multiple execution runs would be performed and one or more state errors would be injected per execution run to assess code and processor resilience. In certain scenarios, code changes may be made to engineer more robust execution outcomes.

In an embodiment, host 121 is coupled to a PCIe interface 131 within the processing unit 130. More generally, any host interface may be implemented in place of the PCIe interface 131. As shown, a programmable management unit (PMU) 132 is coupled to the PCIe interface 131, and an in-silicon fault injection (ISFI) circuit 133. The PMU 132 is configured to receive commands from the fault injection system 124 through the PCIe interface 131. For example, the PMU 132 may receive a command from the fault injection system 124 to inject a state error at a particular storage circuit or RAM bit within the processing unit 130. The PMU 132 may then direct the ISFI circuit 133 to perform a series of steps to inject the state error according to the command. The PMU 132 may be configured to execute programming instructions, such as microcode, and may be programmed to control the operation of various hardware sub-circuits within processing unit 130.

In an embodiment, the ISFI 133 is configured to inject a state error in a GPC 140. In certain embodiments, the GPC 140 may comprise an instance of general processing clusters (GPCs) 350 of FIG. 3. For example, ISFI 133 may perform steps 104 through 110 of method 100 of FIG. 1A to inject the state error. While injecting a state error is described herein with respect to GPC 140, ISFI 133 may be configured to inject state error in any other subsystem within processing unit 130. In an embodiment, the ISFI 133 is coupled to a scan controller 135, which may function according to Institute of Electrical and Electronic Engineers (IEEE) standard suite 1149 and/or IEEE standard suite 1500 for scan functions. More generally, the scan controller 135 may function according to any other technically appropriate scan techniques that provide access to internal state within GPC 140. In an embodiment, scan controller 135 transmits select signal 145 to GPC 140 to cause the GPC 140 to operate in either the functional mode or the scan mode. The scan controller 135 may also transmit scan debug input signal 147 and receive scan debug output signal 149. In an embodiment, the scan controller 135 may operate in a test mode for controlling and reading internal state of GPC 140, and a fault injection mode for injecting state faults. The scan controller 135 may manage any combination of single scan chains or hierarchical scan chains comprising multiple different scan chains that may be selectively bypassed or included in a given overall scan chain structure for a particular scan operation.

A clock generator 134 may be configured to generate a functional clock signal 141 used by clocked circuitry (e.g., storage circuits, RAM circuits) within GPC 140 during normal operation. The clock generator 134 may also generate a scan clock signal 143 used by clocked circuitry within GPC 140 during scan operations for accessing internal state. In an embodiment, the clock generator 134 is configured to synchronously halt and start the functional clock signal 141 and the scan clock signal 143. In an embodiment, the PMU 132 is configured to control the clock generator 134 with respect to the functional clock signal 141 and the scan clock signal 143. In another embodiment, the ISFI 133 is configured to control the clock generator 134 with respect to the functional clock signal 141 and the scan clock signal 143.

The GPC 140 includes a plurality of storage circuits 144. The plurality of storage circuits 144 may be configured to form a scan chain (scan mode) as shown in FIG. 1B. In an embodiment, the ISFI 133 is configured to receive a stream of state information from the scan chain, and to transmit a stream of state information back to the scan chain. The scan chain may use the scan clock signal 143 for shifting (scanning) the stream of state information. During normal operation of the GPC 140 (functional mode), the plurality of storage circuits 144 are configured to perform control and computation operations and operate using the functional clock signal 141. The GPC 140 can also include RAM circuits 148, which may operate in a functional mode using the functional clock signal 141 or a scan mode using the scan clock signal 143. In the scan mode, the RAM circuits 148 can be configured to provide access to individual words and bits stored therein.

Processing unit 130 may include multiple clock domains that may each operate at a different frequency and/or different phase with respect to functional clock signal 141. Furthermore, different circuit subsystems within processing unit 130 may operate using one or more of the multiple clock domains. For example, processing unit 130 may include multiple instances of GPC 140 (not shown), with each instance of GPC 140 configured to operate in a different clock domain. In another example, PCIe interface 131 may operate within a different clock domain than GPC 140.

In an embodiment, a crossbar circuit (XBAR) 137 is configured to transmit data between GPC 140 and the different circuit subsystems. In an embodiment, crossbar circuit 137 comprises XBar 370 of FIG. 3. The crossbar circuit 137 includes a set of first-in first-out (FIFO) 139 circuits configured to transmit data to the GPC 140 and receive data from GPC 140. A companion set of FIFOs 146 may be implemented within GPC 140. The FIFOs 139 and/or FIFOs 146 may be asynchronous FIFOs configured to transmit data between a clock domain of the functional clock signal 141 and a different clock domain of the crossbar circuit 137. The crossbar circuit 137 may be coupled to one or more other instances of GPC 140 and configured to provide communication among the GPC 140 and the one or more other instances of GPC 140. The crossbar circuit 137 may also be coupled to one or more memory partitions, such as a memory partition unit 380 shown in FIG. 3. In general, the crossbar circuit 137 is configured to receive data from one subsystem within processing unit 130 and transmit the data to another subsystem within the processing unit 130. Each subsystem may operate on an independent clock and each interface between the crossbar circuit 137 and a given subsystem may be asynchronous.

When the GPC 140 switches from operating in the functional mode to operating in the scan mode, the functional clock signal 141 is synchronously disabled. Subsequently, the scan clock signal 143 is synchronously enabled. Similarly, when the GPC 140 switches from operating in the scan mode to the functional mode, the scan clock signal 143 is synchronously disabled and the functional clock 141 is synchronously enabled. To synchronously disable a clock signal, an edge is detected in the clock signal and the clock signal is then gated to maintain state. For example, a falling edge may be detected and the clock signal is then gated low (forced to a low logic level). In an embodiment, a multiplexer circuit at a clock endpoint may synchronously select between the functional clock signal 141 and the scan clock signal 143. In the case of synchronously selecting, the multiplexer circuit is switched from the functional clock signal 141 after the functional clock signal 141 is disabled and to the scan clock signal 143 before the scan clock signal 143 is enabled. In alternative embodiments, different clocking techniques may be used to provide both a functional clock for functional operation and a scan clock for scan operation without departing the scope and spirit of the present disclosure.

In an embodiment, waiting for the at least one halt condition to be satisfied at step 106 of method 100 includes comprises waiting for FIFOs 139 to become inactive, with no asynchronous boundary crossings pending. In such an embodiment, the asynchronous buffers comprise FIFOs 139 and/or FIFOs 146, and the subsystem comprises CPG 140. In an embodiment, halting execution at step 108 of method 100 includes synchronously disabling functional clock signal 141. Crossbar circuit 137 may be configured to receive a halt command, which stalls outbound data from FIFOs 139. Furthermore, crossbar circuit 137 may also generate a ready signal to indicate FIFOs 139 are inactive.

Figure 1C:
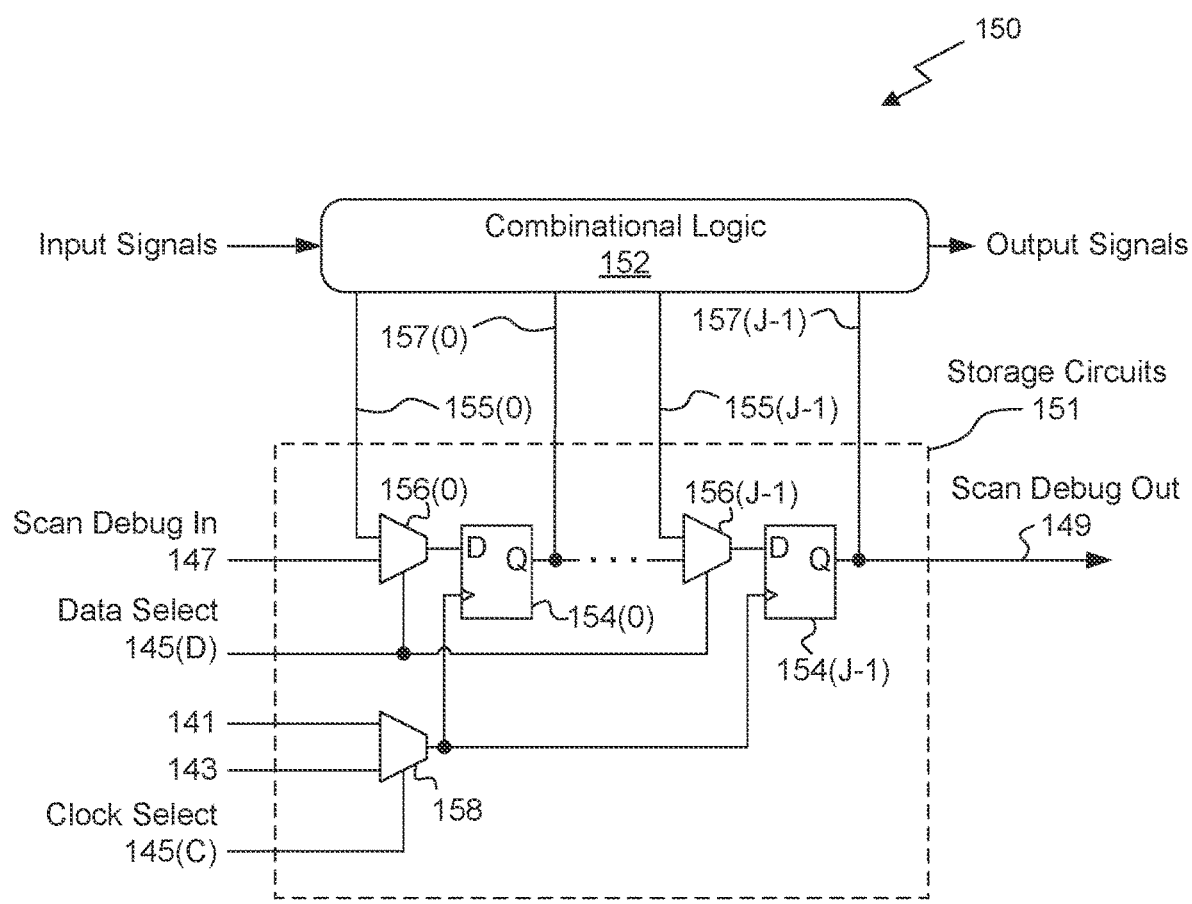
FIG. 1C illustrates a generic logic circuit configured to operate in a functional mode or a scan mode, in accordance with an embodiment.

FIG. 1C illustrates a generic logic circuit 150 configured to operate in the functional mode or the scan mode, in accordance with an embodiment. The generic logic circuit 150 may include storage circuits 151 and combinational logic 152. The storage circuits 151 include flip-flop circuits 154 that provide state storage. In other embodiments, latches (not shown) may replace the flip-flop circuits 154. In an embodiment, the storage circuits 151 comprise the storage circuits 144 of FIG. 1B.

In the functional mode, a clock select signal 145(C) causes multiplexor 158 to select the functional clock signal 141 as an operational clock signal for the flip-flop circuits 154. In the scan mode, the clock select signal 145(C) causes multiplexor 158 to select the scan clock signal 143 as the operational clock signal for the flip-flop circuits 154.

In the functional mode, a data select signal 145(D) causes multiplexors 156 to select combinational logic signals 155 generated for functional mode operation by the combinational logic 152 to be transmitted to corresponding data (D) inputs of the flip-flop circuits 154. Outputs (Q) 157 form the flip-flop circuits 154 may be transmitted to the combinational logic 152 and used for computing the combinational logic signals 155. The combinational logic 152 may also receive other input signals and generate certain output signals according to specific design requirements.

In scan mode, the data select signal 145(D) causes multiplexors 156 to configure the flip-flop circuits 154 into a scan chain, with a first flip-flop circuit 154(0) of the scan chain receiving scan input data from a scan debug input signal 147, and the last flip-flop circuit 154(J-1) in the scan chain transmitting output data 157(J-1) as a scan debug out signal 149. In an embodiment, the scan debug input signal 147 is received from the scan controller 135 of FIG. 1B, and the scan debug out signal 149 is transmitted to the scan controller 135.

Figure 1D:
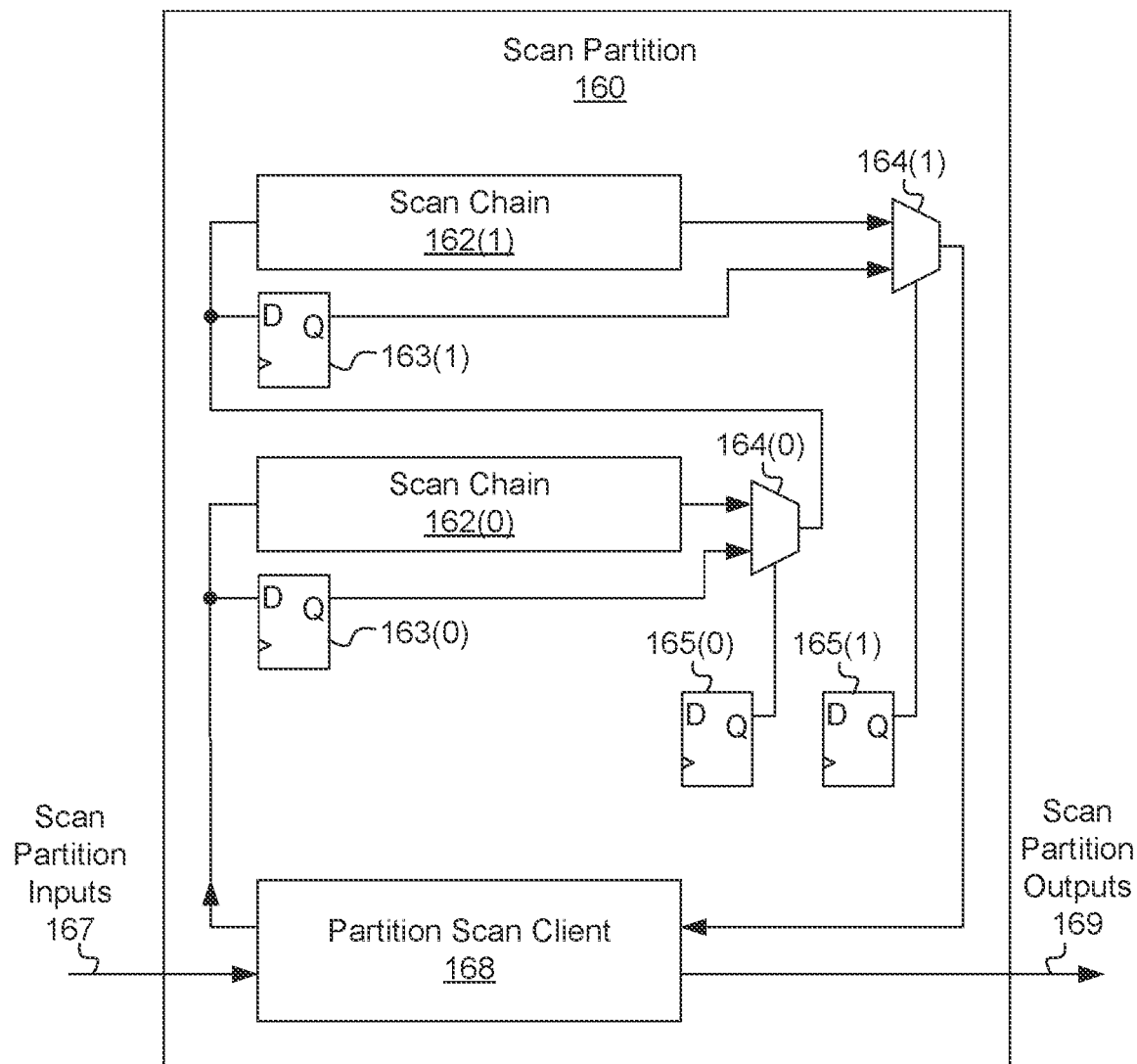
FIG. 1D illustrates a scan partition comprising two scan chains, in accordance with an embodiment.

FIG. 1D illustrates a scan partition 160 comprising two scan chains 162, in accordance with an embodiment. Each scan chain 162 may comprise the storage circuits 151 of FIG. 1C configured to operate in a scan chain. As shown, a scan partition client 168 is configured to receive scan partition inputs 167 and generate scan partition outputs 169. The scan partition 160 may be configured to selectively include one or both of scan chain 162(0) and scan chain 162(1) in given scan chain configuration. A bypass flip-flop 163(0) may be used in conjunction with multiplexor 164(0) to bypass scan chain 163(0), thereby forming a scan chain configuration that only includes storage circuits within scan chain 162(1). Separately, bypass flip-flop 163(1) may be used in conjunction with multiplexor 164(1) to bypass scan chain 163(1), thereby forming a scan chain configuration that only includes storage circuits within the scan chain 162(0). Configuration flip-flips 165 may be configured to hold configuration state for respective multiplexors 164 during scan operations. In an embodiment, scan partition inputs 167 include scan data and scan commands, and scan partition outputs 169 also include scan data and scan commands (e.g., transmitted through partition scan client 168). In an embodiment, partition scan client 168 comprises an IEEE Std. 1500 wrapper, as defined in the art.

Figure 1E:
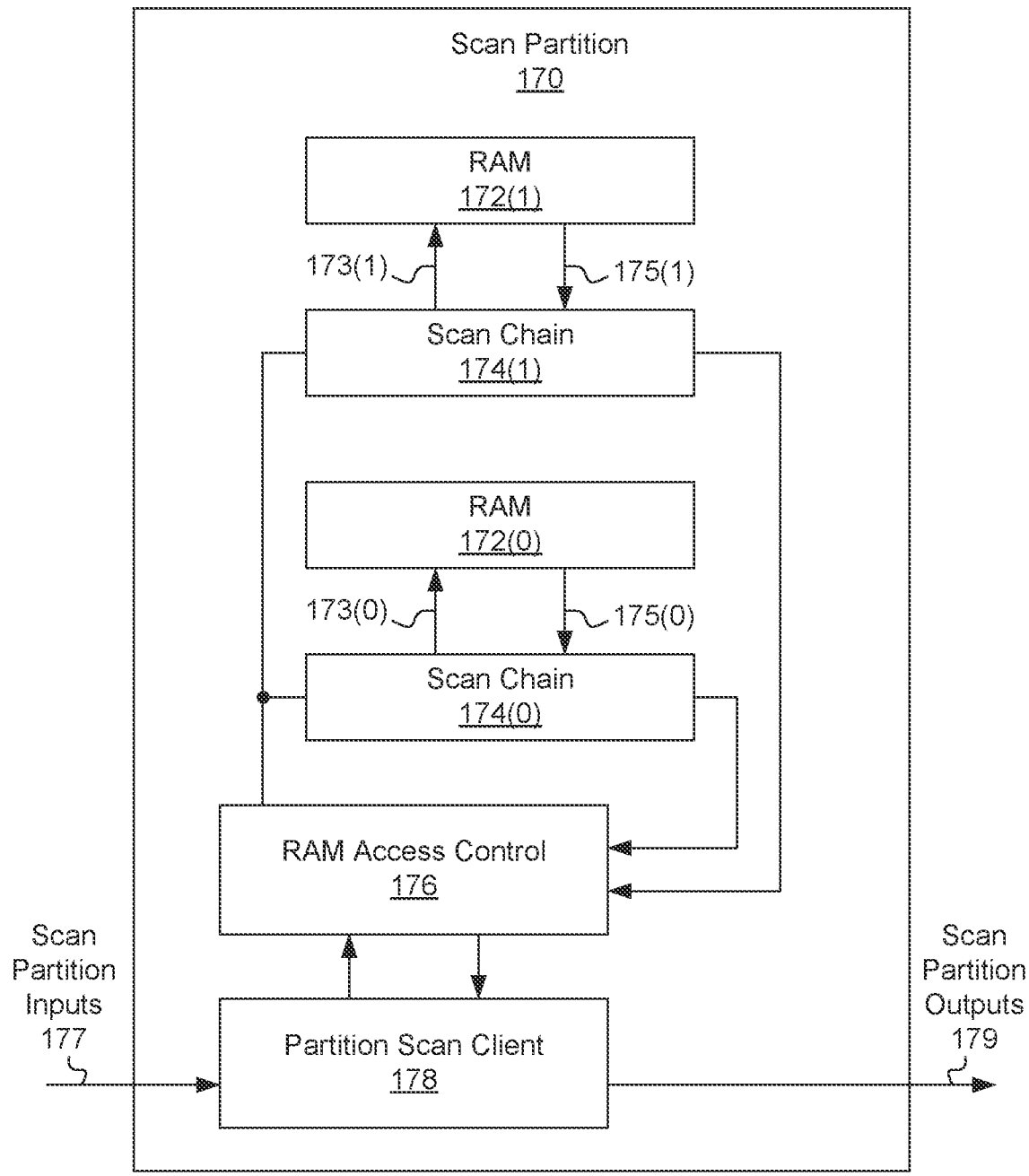
FIG. 1E illustrates a scan partition comprising two random access memory (RAM) circuits, in accordance with an embodiment.

FIG. 1E illustrates a scan partition 170 comprising two random access memory (RAM) circuits 172, in accordance with an embodiment. As shown, a scan partition client 178 is configured to receive scan partition inputs 177 and generate scan partition outputs 179. The RAM circuits 172 may transmit RAM read data 175 to storage circuits (e.g., flip-flops) comprising a respective scan chain 174. The RAM circuits 172 may also receive a RAM address and write data 173 from the storage circuits.

In the functional mode, the RAM circuits 172 may drive RAM read data 175 through combinational paths to generate bits of resulting data. The storage circuits may sample and store the resulting data as part of a next-state calculation performed in response to a clock signal transition (e.g., a rising clock edge). Storage circuits that sample and store the resulting data for a given RAM circuit 172 through a combinational logic path are defined herein to be within a combinational influence of the RAM circuit 172. The combinational logic path may include a direct connection from the RAM circuit 172 to a storage circuit, or any number of intervening combinational logic circuits.

In a scan mode scenario where a state error is to be injected into a specific storage cell (bit) within a given RAM circuit 172, only the state of the storage cell should be altered. To avoid incidentally injecting additional state errors into the storage circuits, the state of all storage circuits within the combinational influence of the RAM circuit 172 may be scanned out and saved prior to injecting the state error in the storage cell. The state of the storage circuits may subsequently be scanned in and restored after the state error has been injected into the RAM circuit 172. A RAM access control circuit 176 may be configured to perform operations related to saving and restoring state for the storage circuits. The RAM access control circuit 176 may also be configured to facilitate or directly perform RAM read-modify-write operations for inverting a selected bit of data within a selected RAM circuit 172. In an embodiment, all storage circuits within a combination influence of a given RAM circuit 172 are organized into a corresponding scan chain 174.

As shown, a scan partition client 178 is configured to receive scan partition inputs 177 and generate scan partition outputs 179. In an embodiment, scan partition inputs 177 include inbound scan data and scan commands, and scan partition outputs 179 also include outbound scan data and scan commands (e.g., transmitted through partition scan client 178). Data residing in storage circuits within the combinational influence of a given RAM circuit 172 may be scanned out and scanned back in through the partition scan client 178. Furthermore, partition scan client 178 may be coupled to one or more peer partition scan clients (not shown) to form a chain and/or hierarchy of scan chain circuits.

In an embodiment, scan data and/or scan commands may comprise information that identifies a specific bit in a specific word in a specific RAM circuit 172 to be inverted for state error injection. In such an embodiment, a RAM access control circuit 176 is configured to perform a read-modify-write operation on the specific word in the specific RAM circuit 172 to invert the specific bit. In certain embodiments, the scan data and/or scan commands may comprise instructions to read and write data words stored in the RAM circuit 172, with write data received from scan partition inputs 177 and read data transmitted from scan partition outputs 179. In an embodiment, partition scan client 178 comprises an IEEE Std. 1500 wrapper, as defined in the art.

Figure 1F:
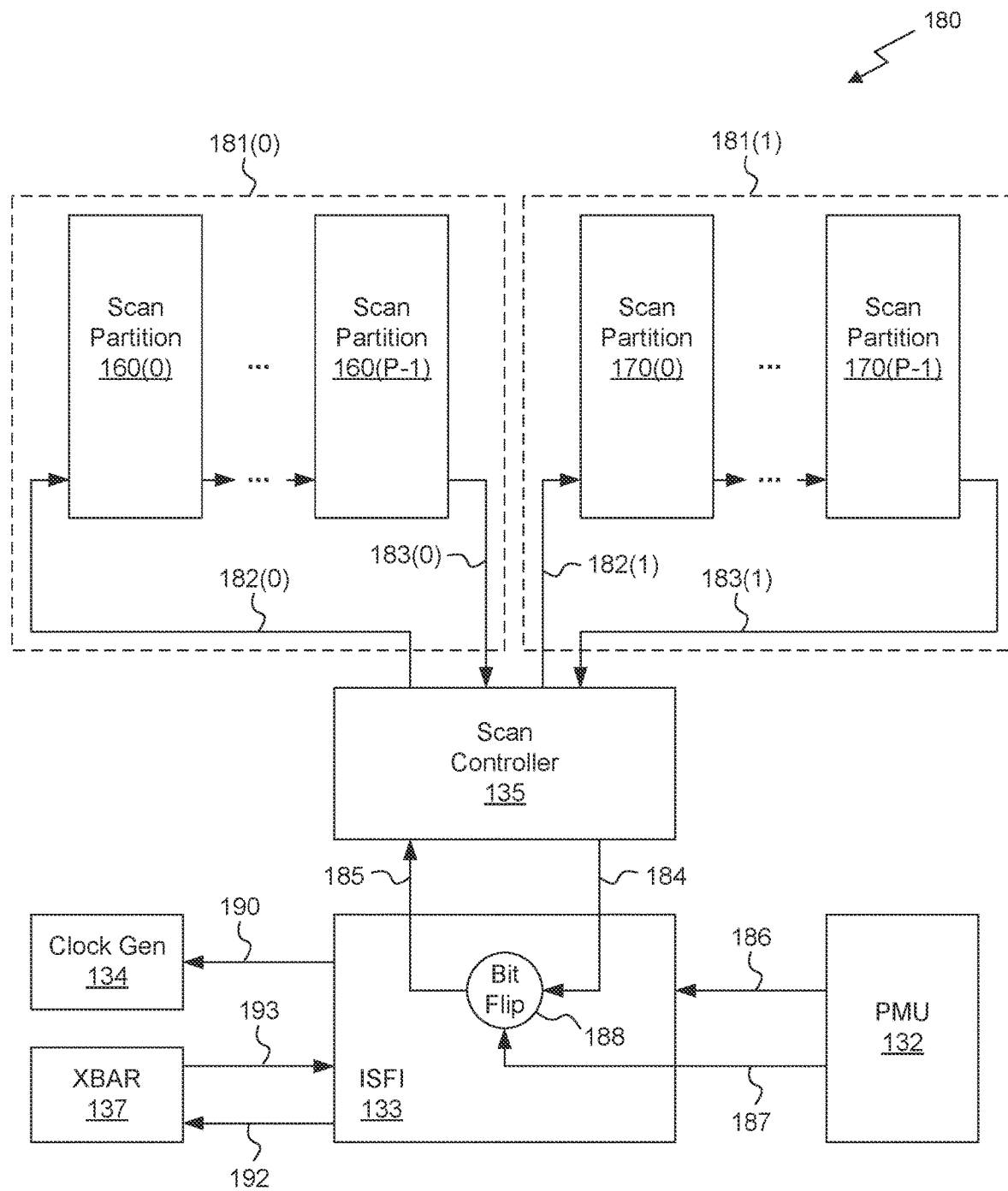
FIG. 1F illustrates a subsystem of a processing unit comprising multiple scan partitions, in accordance with an embodiment.

FIG. 1F illustrates a subsystem 180 of a processing unit (e.g., processing unit 130 of FIG. 1B) comprising multiple scan partitions 160, 170, in accordance with an embodiment. As shown, the scan partitions 160, 170 may be chained into one or more subsystem scan chains 181. For example, scan partition 160(0) and 160(1) are chained to form a subsystem scan chain 181(0), with scan partition inputs 182(0) and scan partition outputs 183(0). Similarly, scan partition 170(0) and 170(1) are chained to form a subsystem scan chain 181(1), with scan partition inputs 182(1) and scan partition outputs 183(1). Each scan partition 160 may comprise one or more scan chains, such as scan chains 162 of FIG. 1D. Each scan partition 170 may comprise one or more RAM circuits 172 and corresponding scan chains 174.

Internal state data from a subsystem scan chain 181 may be serially scanned through the scan controller 135 and the ISFI 133, with each bit of internal state data shifted along a path an appropriate number of times to return the bit to its original storage circuit. The internal state data is sequentially scanned through a bit flip circuit 188, with inbound data arriving from a scan input signal 184 and outbound data transmitted through a scan output signal 185. The bit flip circuit 188 may be configured to either copy or invert a given bit of the internal state data (e.g., an X-OR function). Only an identified bit of internal state data is inverted. The bit may be identified, without limitation, by position in a scan chain 162, position in a scan partition 160, or position in a subsystem scan chain 181(0). When the identified bit of internal state data is presented to the bit flip circuit 188, a state error injection signal 187 may be asserted active by the PMU 132. Alternatively, state error injection signal 187 may instead indicate which bit position within the scan chain should be inverted, and circuitry within the ISFI 133 counts bit positions until a match is found.

Internal state for a RAM circuit 172 may be modified (inverted) to inject a state error using a command transmitted to a corresponding scan partition 170, causing a read-modify-write to be internally performed on the RAM circuit 172. In an embodiment, the command identifies which bit should be inverted for a given addressed word of a specified instance of a RAM circuit 172. Command data, including a state error injection command, may be transmitted to the ISFI 133 through a command signal 186.

In an alternative embodiment, the addressed word is scanned along a scan path through the scan controller 135 and the bit flip circuit 188, and scanned back along the scan path to be written back to the RAM circuit 172. State data residing in storage circuits within the combinational influence of the RAM circuit 172 may also be scanned along the scan path and stored for later restoration to the storage circuits.

In an embodiment, clock generator 134 may be controlled by ISFI 133 to enable and disable functional clock signal 141 and scan clock signal 143 of FIG. 1B. As shown, ISFI 133 may transmit a set of one or more clock control signals 190. The clock control signals 190 may be configured to indicate to the clock generator 134 which clock signal should be enabled and which clock signal should be disabled.

In an embodiment, the ISFI 133 is configured to receive a halt command, such as from command signal 186, generated by the PMU 132. In response to the halt command, the ISFI 133 transmits a halt request signal 192 to the crossbar circuit 137. Any technically feasible technique may be implemented to cause relevant FIFOs within the crossbar circuit 137 (e.g., FIFOs 139) to become inactive. Once the relevant FIFOs are inactive and no pending transactions are at an asynchronous boundary crossing, the crossbar circuit 137 may transmit a halt ready signal 193, indicating to the ISFI 133 that no asynchronous boundary crossing is pending and a halt condition has been satisfied.

Figure 2A:
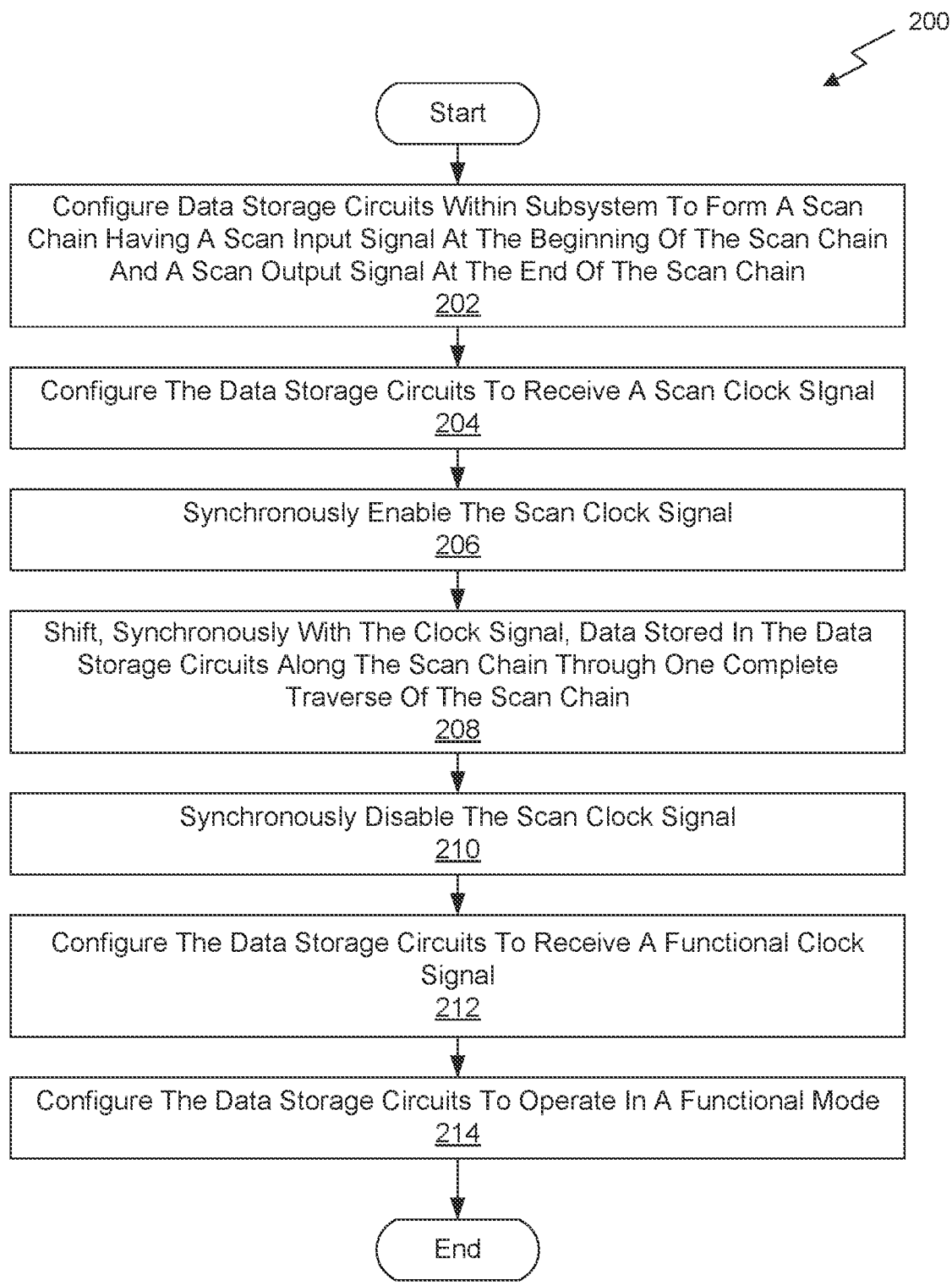
FIG. 2A illustrates a flowchart of a method for injecting a state error at a specified data storage circuit, in accordance with an embodiment.

FIG. 2A illustrates a flowchart of a method 200 for injecting a state error at a specified data storage circuit, in accordance with an embodiment. Although method 200 is described in the context of a processing unit, the method 200 may also be performed by a program executed by a processing unit, any custom circuitry, or by a combination of custom circuitry and a program. For example, the method 200 may be executed by circuitry within a GPU (graphics processing unit), circuitry within a CPU (central processing unit), or any other technically feasible processor, such as parallel processing unit (PPU) 300 of FIG. 3. Furthermore, persons of ordinary skill in the art will understand that any system that performs method 200 is within the scope and spirit of various embodiments. In an embodiment, method 200 is performed by a GPU device comprising the ISFI circuit 133 of FIG. 1B.

At step 202, the processing unit configures data storage circuits (e.g., storage circuits 144) within a specified subsystem (e.g., GPC 130) of the processing unit to form a scan chain having a scan input signal (e.g., scan debug input signal 147) at the beginning of the scan chain and a scan output signal (e.g., scan debug output signal 149) at the end of the scan chain. During normal operation, each data storage circuit of the data storage circuits includes an initial data value. Each initial value may represent a functional mode value residing at the storage circuit at the time processing was halted in the specified subsystem.

At step 204, the processing unit configures the data storage circuits to receive (operate using) a scan clock signal (e.g., scan clock signal 143). At step 206, the processing unit synchronously enables the scan clock signal. At step 208, the processing unit shifts (scans), synchronously with the scan clock signal, data stored in the data storage circuits along the scan chain through one complete traverse of the scan chain. In an embodiment, the scan output signal is configured to loop back into the scan input signal (e.g., through the scan controller 135). In an embodiment, an initial data value for the specified data storage circuit is inverted at the scan input signal during a corresponding clock count of the scan clock signal.

At step 210, the processing unit synchronously disables the scan clock signal. At step 212, the processing unit configures the data storage circuits to receive the functional clock signal. At step 214, the processing unit configures the data storage circuits to operate in the functional mode. Configuring the data storage circuits to operate in the functional mode may include, without limitation, switching a selection multiplexor circuit (e.g., multiplexor circuits 156) to select combinational logic signals 155 generated for functional mode operation.

Figure 2B:
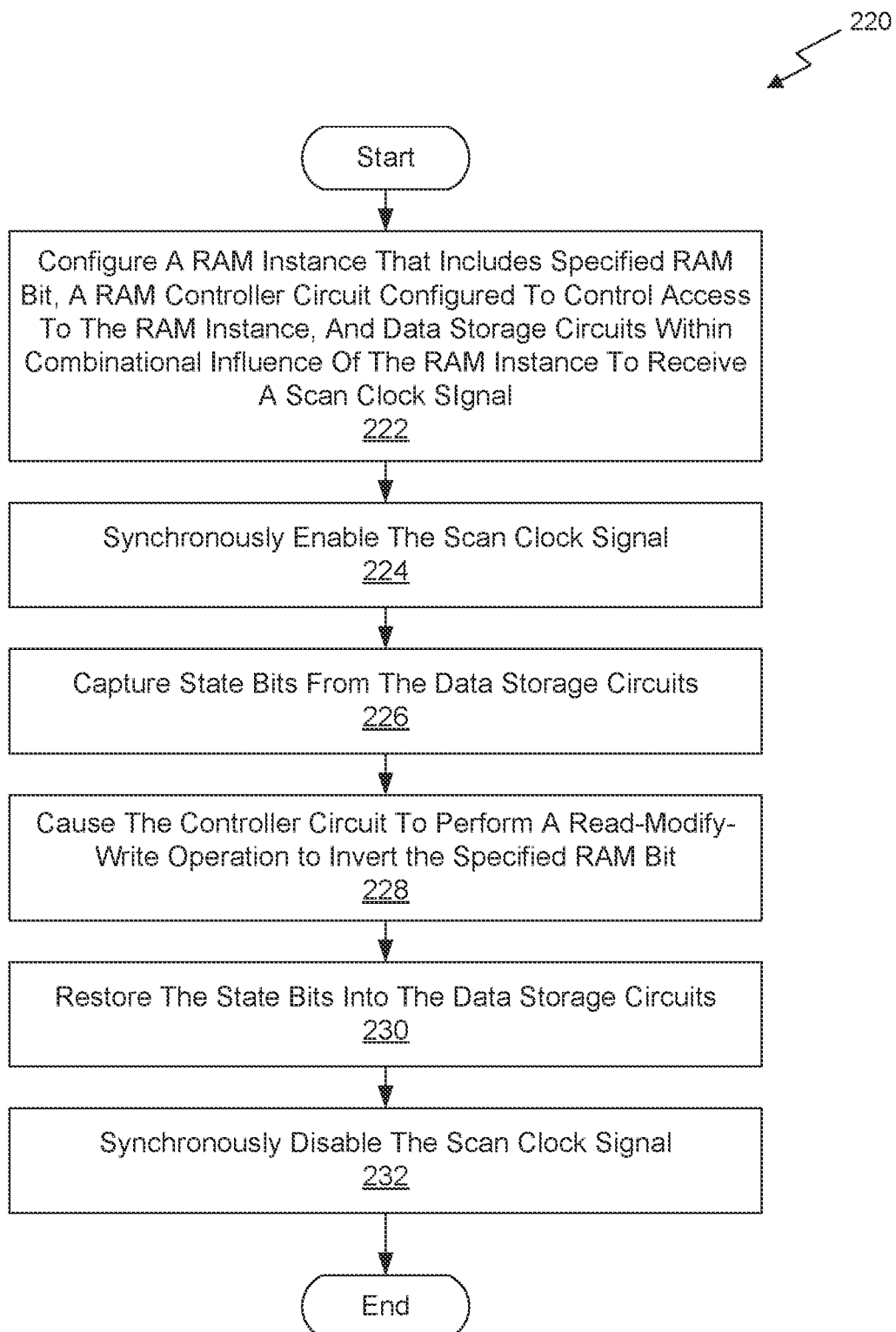
FIG. 2B illustrates a flowchart of a method for injecting a state error at a specified RAM bit, in accordance with an embodiment.

FIG. 2B illustrates a flowchart of a method for injecting a state error at a specified RAM bit, in accordance with an embodiment. Although method 220 is described in the context of a processing unit, the method 220 may also be performed by a program executed by a processing unit, any custom circuitry, or by a combination of custom circuitry and a program. For example, the method 220 may be executed by circuitry within a GPU (graphics processing unit), circuitry within a CPU (central processing unit), or any other technically feasible processor, such as parallel processing unit (PPU) 300 of FIG. 3. Furthermore, persons of ordinary skill in the art will understand that any system that performs method 220 is within the scope and spirit of various embodiments. In an embodiment, method 220 is performed by a GPU device comprising the ISFI circuit 133 of FIG. 1B.

At step 222, the processing unit configures the following sub-circuits to receive a scan clock signal (e.g., scan clock signal 143 of FIG. 1B): a RAM instance (e.g., a RAM circuit 172 of FIG. 1E) that includes the specified RAM bit, a RAM controller circuit (e.g., RAM access control 176) configured to control access to the RAM instance, and data storage circuits within combinational influence of the RAM instance. At step 224, the processing unit synchronously enables the scan clock signal.

At step 226, the processing unit captures state bits from the data storage circuits. At step 228, the processing unit causes the RAM controller circuit to perform a read-modify-write operation to invert the specified RAM bit. At step 230, the processing unit restores the state bits into the data storage circuits. In an embodiment, the state bits are restored by scanning the state bits back into corresponding data storage circuits. At step 232, the processing unit synchronously disables the scan clock signal.

In an embodiment, to capture the state bits from the data storage circuits, the processing unit configures the data storage circuits to form a scan chain and shift the state bits from the data storage circuits into the temporary memory circuit. In an embodiment, to restore the state bits from the temporary memory circuit to the data storage circuits, the processing unit is configured to shift the state bits from the temporary memory circuit into the data storage circuits.

Methods and apparatuses are disclosed for targeted fault injection to provide assessment of resilience in a GPU. A fault injection causes a specific circuit level state error within an otherwise unaltered multi-threaded GPU program. The GPU program can be run normally until a halt condition is satisfied, at which point a state error is injected into the GPU circuitry, and the GPU is subsequently allowed to continue execution of the GPU program. In an embodiment, production scan testing infrastructure within the GPU is augmented to facilitate state error injection. The disclosed techniques may be employed to assess a plurality of different, specific state error conditions at any point or points of program execution. For example, large regression tests may be advantageously performed using the disclosed techniques, and especially vulnerable circuit elements may be identified and/or included in the regression tests. Assessments of resilience may be used to engineer more robust applications for a given GPU. Furthermore, assessments of resilience may also be used to identify vulnerable circuits in one device generation and to engineer improved resilience in a subsequent device generation, for example through improved architecture and/or hardware design.

Parallel Processing Architecture

Figure 3:
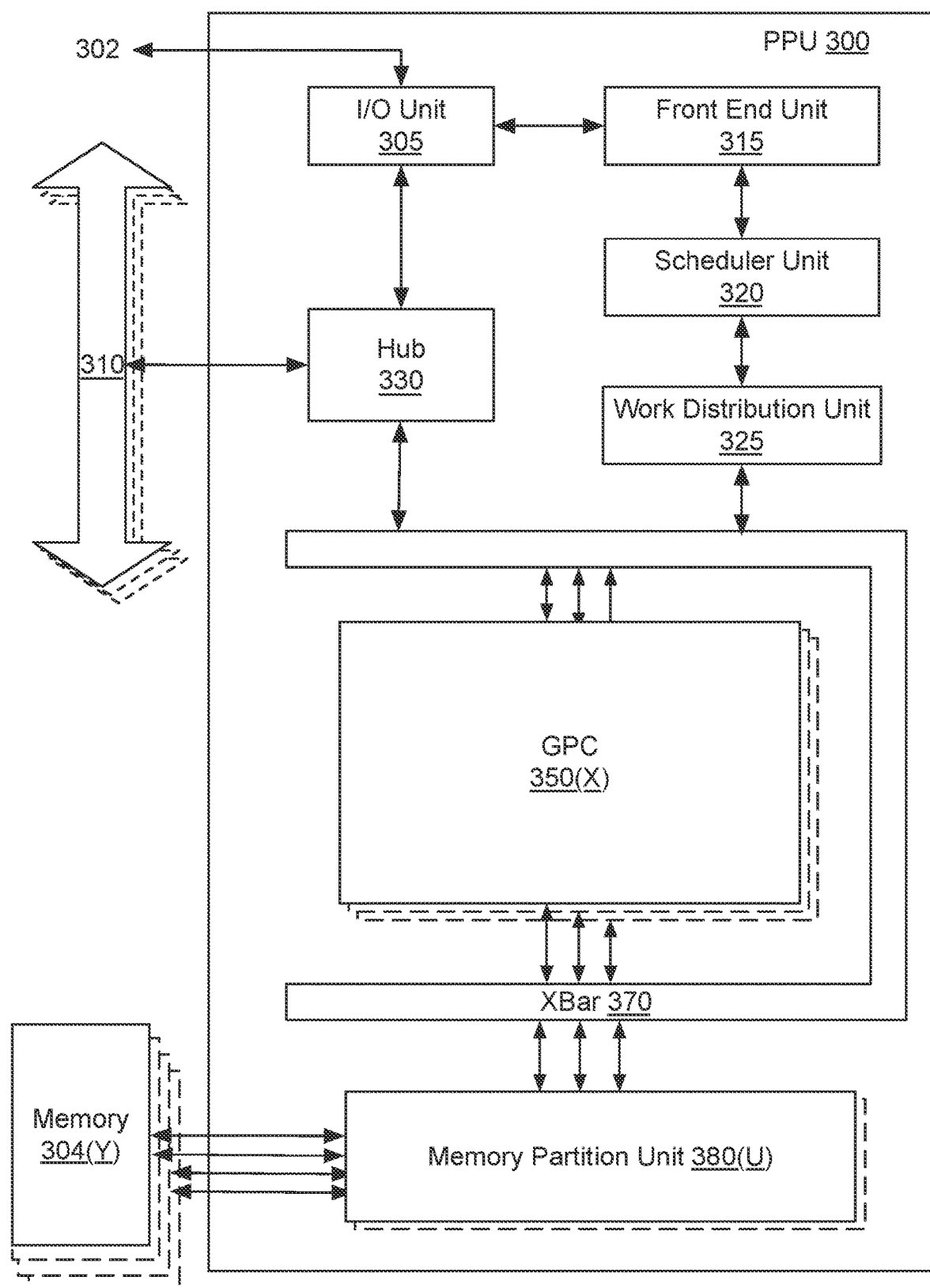
FIG. 3 illustrates a parallel processing unit, in accordance with an embodiment.

FIG. 3 illustrates a parallel processing unit (PPU) 300, in accordance with an embodiment. In an embodiment, the PPU 300 is a multi-threaded processor that is implemented on one or more integrated circuit devices. The PPU 300 is a latency hiding architecture designed to process many threads in parallel. A thread (i.e., a thread of execution) is an instantiation of a set of instructions configured to be executed by the PPU 300. In an embodiment, the PPU 300 is a graphics processing unit (GPU) configured to implement a graphics rendering pipeline for processing three-dimensional (3D) graphics data in order to generate two-dimensional (2D) image data for display on a display device such as a liquid crystal display (LCD) device. In other embodiments, the PPU 300 may be utilized for performing general-purpose computations. While one exemplary parallel processor is provided herein for illustrative purposes, it should be strongly noted that such processor is set forth for illustrative purposes only, and that any processor may be employed to supplement and/or substitute for the same.

One or more PPUs 300 may be configured to accelerate thousands of High Performance Computing (HPC), data center, and machine learning applications. The PPU 300 may be configured to accelerate numerous deep learning systems and applications including autonomous vehicle platforms, deep learning, high-accuracy speech, image, and text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, and personalized user recommendations, and the like.

As shown in FIG. 3, the PPU 300 includes an Input/Output (I/O) unit 305, a front end unit 315, a scheduler unit 320, a work distribution unit 325, a hub 330, a crossbar (Xbar) 370, one or more general processing clusters (GPCs) 350, and one or more partition units 380. The PPU 300 may be connected to a host processor or other PPUs 300 via one or more high-speed NVLink 310 interconnect. The PPU 300 may be connected to a host processor or other peripheral devices via an interconnect 302. The PPU 300 may also be connected to a local memory comprising a number of memory devices 304. In an embodiment, the local memory may comprise a number of dynamic random access memory (DRAM) devices. The DRAM devices may be configured as a high-bandwidth memory (HBM) subsystem, with multiple DRAM dies stacked within each device.

The NVLink 310 interconnect enables systems to scale and include one or more PPUs 300 combined with one or more CPUs, supports cache coherence between the PPUs 300 and CPUs, and CPU mastering. Data and/or commands may be transmitted by the NVLink 310 through the hub 330 to/from other units of the PPU 300 such as one or more copy engines, a video encoder, a video decoder, a power management unit, etc. (not explicitly shown). The NVLink 310 is described in more detail in conjunction with FIG. 5B.

The I/O unit 305 is configured to transmit and receive communications (i.e., commands, data, etc.) from a host processor (not shown) over the interconnect 302. The I/O unit 305 may communicate with the host processor directly via the interconnect 302 or through one or more intermediate devices such as a memory bridge. In an embodiment, the I/O unit 305 may communicate with one or more other processors, such as one or more the PPUs 300 via the interconnect 302. In an embodiment, the I/O unit 305 implements a Peripheral Component Interconnect Express (PCIe) interface for communications over a PCIe bus and the interconnect 302 is a PCIe bus. In alternative embodiments, the I/O unit 305 may implement other types of well-known interfaces for communicating with external devices.

The I/O unit 305 decodes packets received via the interconnect 302. In an embodiment, the packets represent commands configured to cause the PPU 300 to perform various operations. The I/O unit 305 transmits the decoded commands to various other units of the PPU 300 as the commands may specify. For example, some commands may be transmitted to the front end unit 315. Other commands may be transmitted to the hub 330 or other units of the PPU 300 such as one or more copy engines, a video encoder, a video decoder, a power management unit, etc. (not explicitly shown). In other words, the I/O unit 305 is configured to route communications between and among the various logical units of the PPU 300.

In an embodiment, a program executed by the host processor encodes a command stream in a buffer that provides workloads to the PPU 300 for processing. A workload may comprise several instructions and data to be processed by those instructions. The buffer is a region in a memory that is accessible (i.e., read/write) by both the host processor and the PPU 300. For example, the I/O unit 305 may be configured to access the buffer in a system memory connected to the interconnect 302 via memory requests transmitted over the interconnect 302. In an embodiment, the host processor writes the command stream to the buffer and then transmits a pointer to the start of the command stream to the PPU 300. The front end unit 315 receives pointers to one or more command streams. The front end unit 315 manages the one or more streams, reading commands from the streams and forwarding commands to the various units of the PPU 300.

The front end unit 315 is coupled to a scheduler unit 320 that configures the various GPCs 350 to process tasks defined by the one or more streams. The scheduler unit 320 is configured to track state information related to the various tasks managed by the scheduler unit 320. The state may indicate which GPC 350 a task is assigned to, whether the task is active or inactive, a priority level associated with the task, and so forth. The scheduler unit 320 manages the execution of a plurality of tasks on the one or more GPCs 350.

The scheduler unit 320 is coupled to a work distribution unit 325 that is configured to dispatch tasks for execution on the GPCs 350. The work distribution unit 325 may track a number of scheduled tasks received from the scheduler unit 320. In an embodiment, the work distribution unit 325 manages a pending task pool and an active task pool for each of the GPCs 350. The pending task pool may comprise a number of slots (e.g., 32 slots) that contain tasks assigned to be processed by a particular GPC 350. The active task pool may comprise a number of slots (e.g., 4 slots) for tasks that are actively being processed by the GPCs 350. As a GPC 350 finishes the execution of a task, that task is evicted from the active task pool for the GPC 350 and one of the other tasks from the pending task pool is selected and scheduled for execution on the GPC 350. If an active task has been idle on the GPC 350, such as while waiting for a data dependency to be resolved, then the active task may be evicted from the GPC 350 and returned to the pending task pool while another task in the pending task pool is selected and scheduled for execution on the GPC 350.

The work distribution unit 325 communicates with the one or more GPCs 350 via XBar 370. The XBar 370 is an interconnect network that couples many of the units of the PPU 300 to other units of the PPU 300. For example, the XBar 370 may be configured to couple the work distribution unit 325 to a particular GPC 350. Although not shown explicitly, one or more other units of the PPU 300 may also be connected to the XBar 370 via the hub 330.

The tasks are managed by the scheduler unit 320 and dispatched to a GPC 350 by the work distribution unit 325. The GPC 350 is configured to process the task and generate results. The results may be consumed by other tasks within the GPC 350, routed to a different GPC 350 via the XBar 370, or stored in the memory 304. The results can be written to the memory 304 via the partition units 380, which implement a memory interface for reading and writing data to/from the memory 304. The results can be transmitted to another PPU 304 or CPU via the NVLink 310. In an embodiment, the PPU 300 includes a number U of partition units 380 that is equal to the number of separate and distinct memory devices 304 coupled to the PPU 300. A partition unit 380 will be described in more detail below in conjunction with FIG. 4B.

In an embodiment, a host processor executes a driver kernel that implements an application programming interface (API) that enables one or more applications executing on the host processor to schedule operations for execution on the PPU 300. In an embodiment, multiple compute applications are simultaneously executed by the PPU 300 and the PPU 300 provides isolation, quality of service (QoS), and independent address spaces for the multiple compute applications. An application may generate instructions (i.e., API calls) that cause the driver kernel to generate one or more tasks for execution by the PPU 300. The driver kernel outputs tasks to one or more streams being processed by the PPU 300. Each task may comprise one or more groups of related threads, referred to herein as a warp. In an embodiment, a warp comprises 32 related threads that may be executed in parallel. Cooperating threads may refer to a plurality of threads including instructions to perform the task and that may exchange data through shared memory. Threads and cooperating threads are described in more detail in conjunction with FIG. 5A.

Figure 4A:
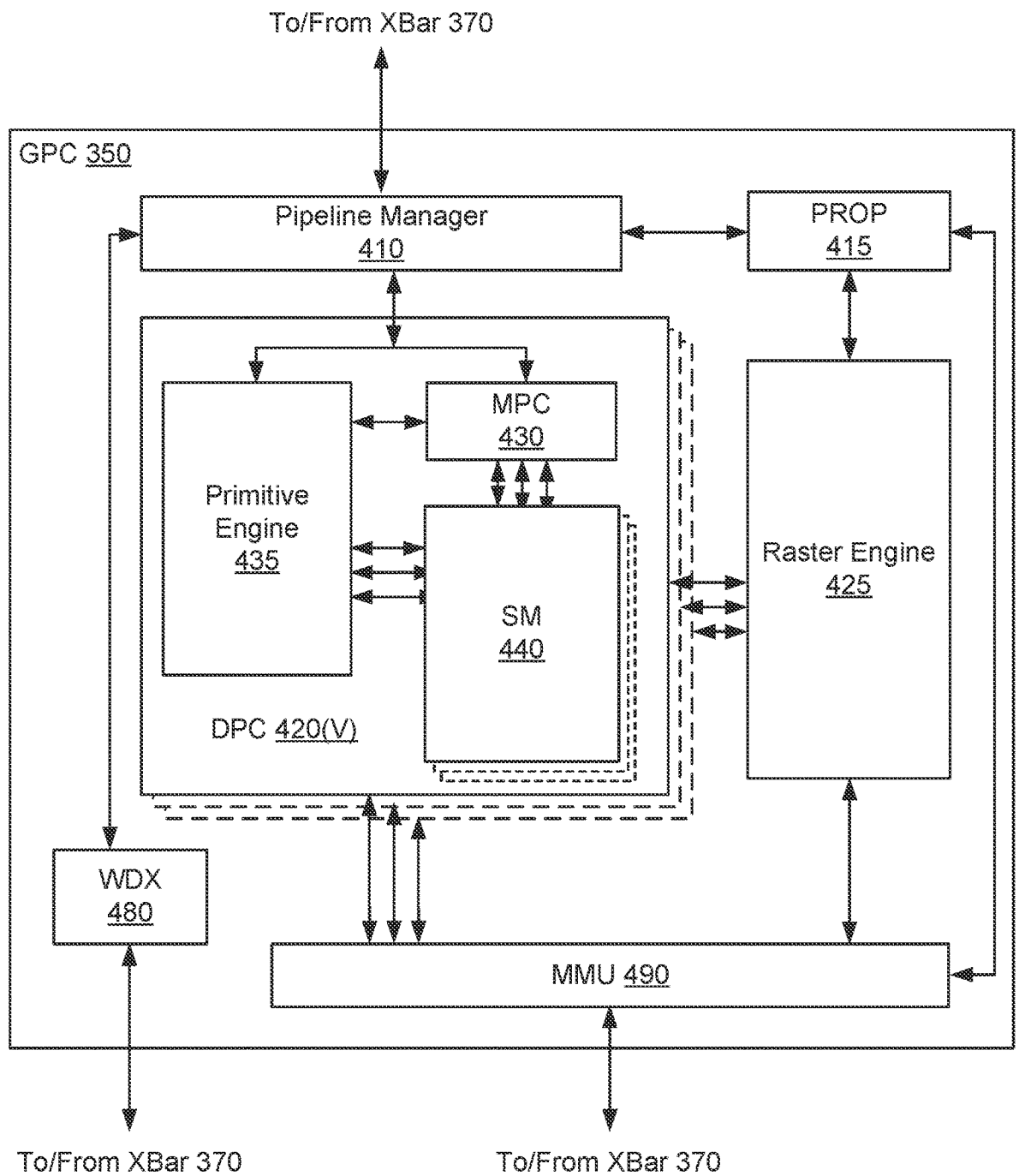
FIG. 4A illustrates a general processing cluster within the parallel processing unit of FIG. 3, in accordance with an embodiment.

FIG. 4A illustrates a GPC 350 of the PPU 300 of FIG. 3, in accordance with an embodiment. As shown in FIG. 4A, each GPC 350 includes a number of hardware units for processing tasks. In an embodiment, each GPC 350 includes a pipeline manager 410, a pre-raster operations unit (PROP) 415, a raster engine 425, a work distribution crossbar (WDX) 480, a memory management unit (MMU) 490, and one or more Data Processing Clusters (DPCs) 420. It will be appreciated that the GPC 350 of FIG. 4A may include other hardware units in lieu of or in addition to the units shown in FIG. 4A.

In an embodiment, the operation of the GPC 350 is controlled by the pipeline manager 410. The pipeline manager 410 manages the configuration of the one or more DPCs 420 for processing tasks allocated to the GPC 350. In an embodiment, the pipeline manager 410 may configure at least one of the one or more DPCs 420 to implement at least a portion of a graphics rendering pipeline. For example, a DPC 420 may be configured to execute a vertex shader program on the programmable streaming multiprocessor (SM) 440. The pipeline manager 410 may also be configured to route packets received from the work distribution unit 325 to the appropriate logical units within the GPC 350. For example, some packets may be routed to fixed function hardware units in the PROP 415 and/or raster engine 425 while other packets may be routed to the DPCs 420 for processing by the primitive engine 435 or the SM 440. In an embodiment, the pipeline manager 410 may configure at least one of the one or more DPCs 420 to implement a neural network model and/or a computing pipeline.

Figure 4B:
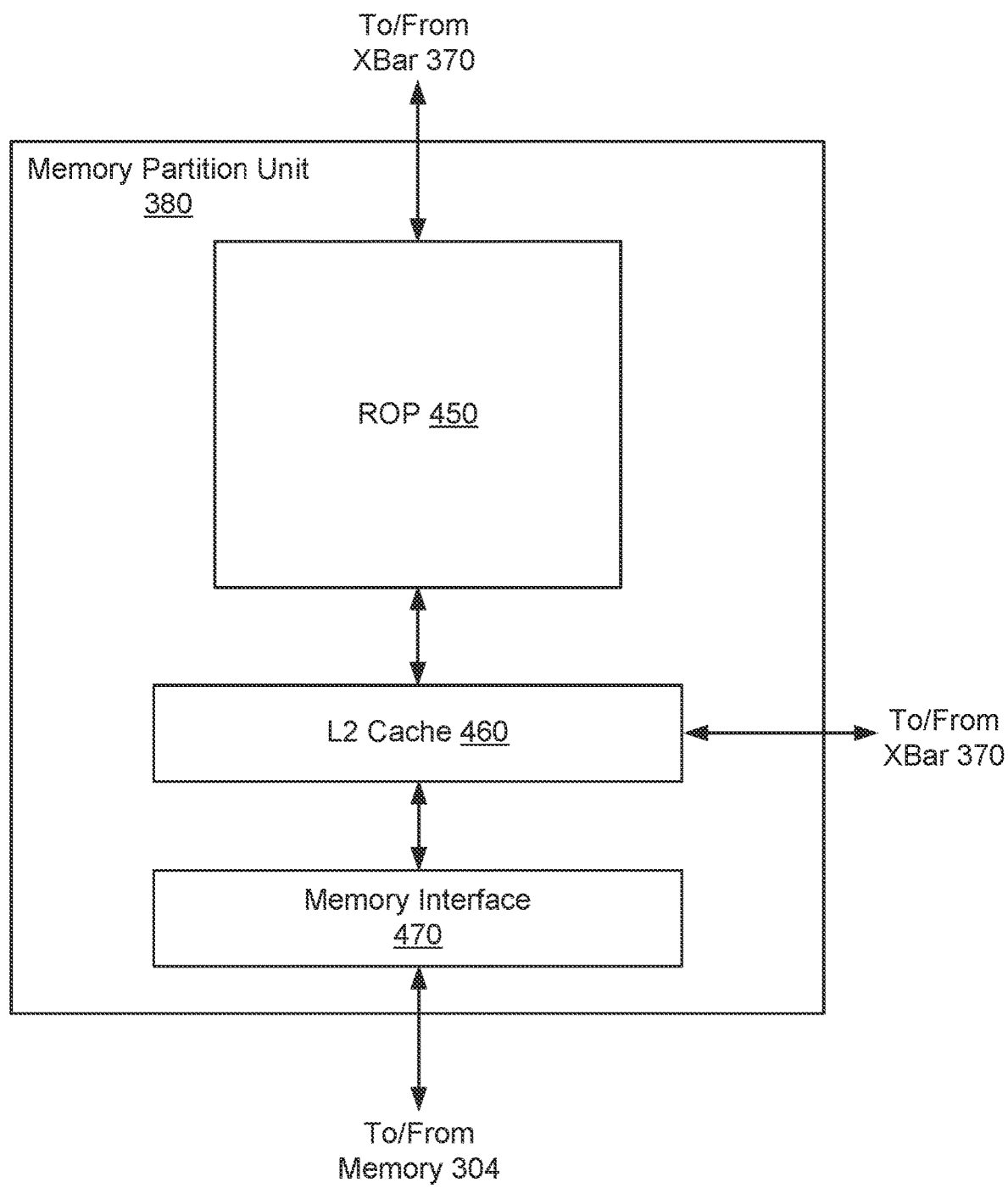
FIG. 4B illustrates a memory partition unit of the parallel processing unit of FIG. 3, in accordance with an embodiment.

The PROP unit 415 is configured to route data generated by the raster engine 425 and the DPCs 420 to a Raster Operations (ROP) unit, described in more detail in conjunction with FIG. 4B. The PROP unit 415 may also be configured to perform optimizations for color blending, organize pixel data, perform address translations, and the like.

The raster engine 425 includes a number of fixed function hardware units configured to perform various raster operations. In an embodiment, the raster engine 425 includes a setup engine, a coarse raster engine, a culling engine, a clipping engine, a fine raster engine, and a tile coalescing engine. The setup engine receives transformed vertices and generates plane equations associated with the geometric primitive defined by the vertices. The plane equations are transmitted to the coarse raster engine to generate coverage information (e.g., an x,y coverage mask for a tile) for the primitive. The output of the coarse raster engine is transmitted to the culling engine where fragments associated with the primitive that fail a z-test are culled, and transmitted to a clipping engine where fragments lying outside a viewing frustum are clipped. Those fragments that survive clipping and culling may be passed to the fine raster engine to generate attributes for the pixel fragments based on the plane equations generated by the setup engine. The output of the raster engine 425 comprises fragments to be processed, for example, by a fragment shader implemented within a DPC 420.

Each DPC 420 included in the GPC 350 includes an M-Pipe Controller (MPC) 430, a primitive engine 435, and one or more SMs 440. The MPC 430 controls the operation of the DPC 420, routing packets received from the pipeline manager 410 to the appropriate units in the DPC 420. For example, packets associated with a vertex may be routed to the primitive engine 435, which is configured to fetch vertex attributes associated with the vertex from the memory 304. In contrast, packets associated with a shader program may be transmitted to the SM 440.

The SM 440 comprises a programmable streaming processor that is configured to process tasks represented by a number of threads. Each SM 440 is multi-threaded and configured to execute a plurality of threads (e.g., 32 threads) from a particular group of threads concurrently. In an embodiment, the SM 440 implements a SIMD (Single-Instruction, Multiple-Data) architecture where each thread in a group of threads (i.e., a warp) is configured to process a different set of data based on the same set of instructions. All threads in the group of threads execute the same instructions. In another embodiment, the SM 440 implements a SIMT (Single-Instruction, Multiple Thread) architecture where each thread in a group of threads is configured to process a different set of data based on the same set of instructions, but where individual threads in the group of threads are allowed to diverge during execution. In an embodiment, a program counter, call stack, and execution state is maintained for each warp, enabling concurrency between warps and serial execution within warps when threads within the warp diverge. In another embodiment, a program counter, call stack, and execution state is maintained for each individual thread, enabling equal concurrency between all threads, within and between warps. When execution state is maintained for each individual thread, threads executing the same instructions may be converged and executed in parallel for maximum efficiency. The SM 440 will be described in more detail below in conjunction with FIG. 5A.

The MMU 490 provides an interface between the GPC 350 and the partition unit 380. The MMU 490 may provide translation of virtual addresses into physical addresses, memory protection, and arbitration of memory requests. In an embodiment, the MMU 490 provides one or more translation lookaside buffers (TLBs) for performing translation of virtual addresses into physical addresses in the memory 304.

FIG. 4B illustrates a memory partition unit 380 of the PPU 300 of FIG. 3, in accordance with an embodiment. As shown in FIG. 4B, the memory partition unit 380 includes a Raster Operations (ROP) unit 450, a level two (L2) cache 460, and a memory interface 470. The memory interface 470 is coupled to the memory 304. Memory interface 470 may implement 32, 64, 128, 1024-bit data buses, or the like, for high-speed data transfer. In an embodiment, the PPU 300 incorporates U memory interfaces 470, one memory interface 470 per pair of partition units 380, where each pair of partition units 380 is connected to a corresponding memory device 304. For example, PPU 300 may be connected to up to Y memory devices 304, such as high bandwidth memory stacks or graphics double-data-rate, version 5, synchronous dynamic random access memory, or other types of persistent storage.

In an embodiment, the memory interface 470 implements an HBM2 memory interface and Y equals half U. In an embodiment, the HBM2 memory stacks are located on the same physical package as the PPU 300, providing substantial power and area savings compared with conventional GDDR5 SDRAM systems. In an embodiment, each HBM2 stack includes four memory dies and Y equals 4, with HBM2 stack including two 128-bit channels per die for a total of 8 channels and a data bus width of 1024 bits.

In an embodiment, the memory 304 supports Single-Error Correcting Double-Error Detecting (SECDED) Error Correction Code (ECC) to protect data. ECC provides higher reliability for compute applications that are sensitive to data corruption. Reliability is especially important in large-scale cluster computing environments where PPUs 300 process very large datasets and/or run applications for extended periods.

In an embodiment, the PPU 300 implements a multi-level memory hierarchy. In an embodiment, the memory partition unit 380 supports a unified memory to provide a single unified virtual address space for CPU and PPU 300 memory, enabling data sharing between virtual memory systems. In an embodiment the frequency of accesses by a PPU 300 to memory located on other processors is traced to ensure that memory pages are moved to the physical memory of the PPU 300 that is accessing the pages more frequently. In an embodiment, the NVLink 310 supports address translation services allowing the PPU 300 to directly access a CPU's page tables and providing full access to CPU memory by the PPU 300.

In an embodiment, copy engines transfer data between multiple PPUs 300 or between PPUs 300 and CPUs. The copy engines can generate page faults for addresses that are not mapped into the page tables. The memory partition unit 380 can then service the page faults, mapping the addresses into the page table, after which the copy engine can perform the transfer. In a conventional system, memory is pinned (i.e., non-pageable) for multiple copy engine operations between multiple processors, substantially reducing the available memory. With hardware page faulting, addresses can be passed to the copy engines without worrying if the memory pages are resident, and the copy process is transparent.

Data from the memory 304 or other system memory may be fetched by the memory partition unit 380 and stored in the L2 cache 460, which is located on-chip and is shared between the various GPCs 350. As shown, each memory partition unit 380 includes a portion of the L2 cache 460 associated with a corresponding memory device 304. Lower level caches may then be implemented in various units within the GPCs 350. For example, each of the SMs 440 may implement a level one (L1) cache. The L1 cache is private memory that is dedicated to a particular SM 440. Data from the L2 cache 460 may be fetched and stored in each of the L1 caches for processing in the functional units of the SMs 440. The L2 cache 460 is coupled to the memory interface 470 and the XBar 370.

The ROP unit 450 performs graphics raster operations related to pixel color, such as color compression, pixel blending, and the like. The ROP unit 450 also implements depth testing in conjunction with the raster engine 425, receiving a depth for a sample location associated with a pixel fragment from the culling engine of the raster engine 425. The depth is tested against a corresponding depth in a depth buffer for a sample location associated with the fragment. If the fragment passes the depth test for the sample location, then the ROP unit 450 updates the depth buffer and transmits a result of the depth test to the raster engine 425. It will be appreciated that the number of partition units 380 may be different than the number of GPCs 350 and, therefore, each ROP unit 450 may be coupled to each of the GPCs 350. The ROP unit 450 tracks packets received from the different GPCs 350 and determines which GPC 350 that a result generated by the ROP unit 450 is routed to through the Xbar 370. Although the ROP unit 450 is included within the memory partition unit 380 in FIG. 4B, in other embodiment, the ROP unit 450 may be outside of the memory partition unit 380. For example, the ROP unit 450 may reside in the GPC 350 or another unit.

Figure 5A:
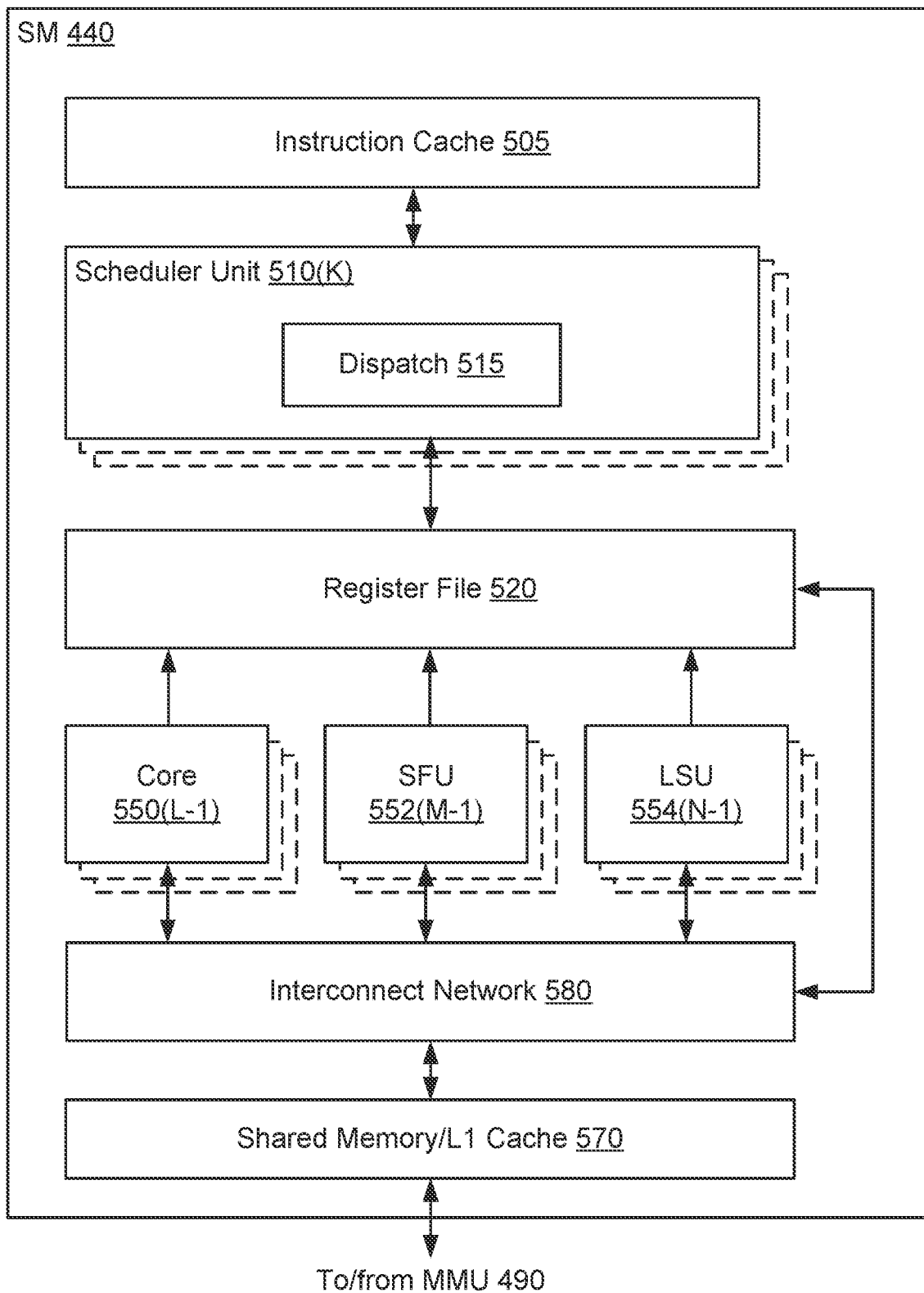
FIG. 5A illustrates the streaming multi-processor of FIG. 4A, in accordance with an embodiment.

FIG. 5A illustrates the streaming multi-processor 440 of FIG. 4A, in accordance with an embodiment. As shown in FIG. 5A, the SM 440 includes an instruction cache 505, one or more scheduler units 510, a register file 520, one or more processing cores 550, one or more special function units (SFUs) 552, one or more load/store units (LSUs) 554, an interconnect network 580, a shared memory/L1 cache 570.

As described above, the work distribution unit 325 dispatches tasks for execution on the GPCs 350 of the PPU 300. The tasks are allocated to a particular DPC 420 within a GPC 350 and, if the task is associated with a shader program, the task may be allocated to an SM 440. The scheduler unit 510 receives the tasks from the work distribution unit 325 and manages instruction scheduling for one or more thread blocks assigned to the SM 440. The scheduler unit 510 schedules thread blocks for execution as warps of parallel threads, where each thread block is allocated at least one warp. In an embodiment, each warp executes 32 threads. The scheduler unit 510 may manage a plurality of different thread blocks, allocating the warps to the different thread blocks and then dispatching instructions from the plurality of different cooperative groups to the various functional units (i.e., cores 550, SFUs 552, and LSUs 554) during each clock cycle.

Cooperative Groups is a programming model for organizing groups of communicating threads that allows developers to express the granularity at which threads are communicating, enabling the expression of richer, more efficient parallel decompositions. Cooperative launch APIs support synchronization amongst thread blocks for the execution of parallel algorithms. Conventional programming models provide a single, simple construct for synchronizing cooperating threads: a barrier across all threads of a thread block (i.e., the syncthreads( ) function). However, programmers would often like to define groups of threads at smaller than thread block granularities and synchronize within the defined groups to enable greater performance, design flexibility, and software reuse in the form of collective group-wide function interfaces.

Cooperative Groups enables programmers to define groups of threads explicitly at sub-block (i.e., as small as a single thread) and multi-block granularities, and to perform collective operations such as synchronization on the threads in a cooperative group. The programming model supports clean composition across software boundaries, so that libraries and utility functions can synchronize safely within their local context without having to make assumptions about convergence. Cooperative Groups primitives enable new patterns of cooperative parallelism, including producer-consumer parallelism, opportunistic parallelism, and global synchronization across an entire grid of thread blocks.

A dispatch unit 515 is configured to transmit instructions to one or more of the functional units. In the embodiment, the scheduler unit 510 includes two dispatch units 515 that enable two different instructions from the same warp to be dispatched during each clock cycle. In alternative embodiments, each scheduler unit 510 may include a single dispatch unit 515 or additional dispatch units 515.

Each SM 440 includes a register file 520 that provides a set of registers for the functional units of the SM 440. In an embodiment, the register file 520 is divided between each of the functional units such that each functional unit is allocated a dedicated portion of the register file 520. In another embodiment, the register file 520 is divided between the different warps being executed by the SM 440. The register file 520 provides temporary storage for operands connected to the data paths of the functional units.

Each SM 440 comprises L processing cores 550. In an embodiment, the SM 440 includes a large number (e.g., 128, etc.) of distinct processing cores 550. Each core 550 may include a fully-pipelined, single-precision, double-precision, and/or mixed precision processing unit that includes a floating point arithmetic logic unit and an integer arithmetic logic unit. In an embodiment, the floating point arithmetic logic units implement the IEEE 754-2008 standard for floating point arithmetic. In an embodiment, the cores 550 include 64 single-precision (32-bit) floating point cores, 64 integer cores, 32 double-precision (64-bit) floating point cores, and 8 tensor cores.

Tensor cores configured to perform matrix operations, and, in an embodiment, one or more tensor cores are included in the cores 550. In particular, the tensor cores are configured to perform deep learning matrix arithmetic, such as convolution operations for neural network training and inferencing. In an embodiment, each tensor core operates on a 4×4 matrix and performs a matrix multiply and accumulate operation D=A×B+C, where A, B, C, and D are 4×4 matrices.

In an embodiment, the matrix multiply inputs A and B are 16-bit floating point matrices, while the accumulation matrices C and D may be 16-bit floating point or 32-bit floating point matrices. Tensor Cores operate on 16-bit floating point input data with 32-bit floating point accumulation. The 16-bit floating point multiply requires 64 operations and results in a full precision product that is then accumulated using 32-bit floating point addition with the other intermediate products for a 4×4×4 matrix multiply. In practice, Tensor Cores are used to perform much larger two-dimensional or higher dimensional matrix operations, built up from these smaller elements. An API, such as CUDA 9 C++ API, exposes specialized matrix load, matrix multiply and accumulate, and matrix store operations to efficiently use Tensor Cores from a CUDA-C++ program. At the CUDA level, the warp-level interface assumes 16×16 size matrices spanning all 32 threads of the warp.

Each SM 440 also comprises M SFUs 552 that perform special functions (e.g., attribute evaluation, reciprocal square root, and the like). In an embodiment, the SFUs 552 may include a tree traversal unit configured to traverse a hierarchical tree data structure. In an embodiment, the SFUs 552 may include texture unit configured to perform texture map filtering operations. In an embodiment, the texture units are configured to load texture maps (e.g., a 2D array of texels) from the memory 304 and sample the texture maps to produce sampled texture values for use in shader programs executed by the SM 440. In an embodiment, the texture maps are stored in the shared memory/L1 cache 470. The texture units implement texture operations such as filtering operations using mip-maps (i.e., texture maps of varying levels of detail). In an embodiment, each SM 340 includes two texture units. In an embodiment, at least one of SFUs 552 is configured to include at least one instance of texture map unit 200.

Each SM 440 also comprises N LSUs 554 that implement load and store operations between the shared memory/L1 cache 570 and the register file 520. Each SM 440 includes an interconnect network 580 that connects each of the functional units to the register file 520 and the LSU 554 to the register file 520, shared memory/L1 cache 570. In an embodiment, the interconnect network 580 is a crossbar that can be configured to connect any of the functional units to any of the registers in the register file 520 and connect the LSUs 554 to the register file and memory locations in shared memory/L1 cache 570.

The shared memory/L1 cache 570 is an array of on-chip memory that allows for data storage and communication between the SM 440 and the primitive engine 435 and between threads in the SM 440. In an embodiment, the shared memory/L1 cache 570 comprises 128 KB of storage capacity and is in the path from the SM 440 to the partition unit 380. The shared memory/L1 cache 570 can be used to cache reads and writes. One or more of the shared memory/L1 cache 570, L2 cache 460, and memory 304 are backing stores.

Combining data cache and shared memory functionality into a single memory block provides the best overall performance for both types of memory accesses. The capacity is usable as a cache by programs that do not use shared memory. For example, if shared memory is configured to use half of the capacity, texture and load/store operations can use the remaining capacity. Integration within the shared memory/L1 cache 570 enables the shared memory/L1 cache 570 to function as a high-throughput conduit for streaming data while simultaneously providing high-bandwidth and low-latency access to frequently reused data.

When configured for general purpose parallel computation, a simpler configuration can be used compared with graphics processing. Specifically, the fixed function graphics processing units shown in FIG. 3, are bypassed, creating a much simpler programming model. In the general purpose parallel computation configuration, the work distribution unit 325 assigns and distributes blocks of threads directly to the DPCs 420. The threads in a block execute the same program, using a unique thread ID in the calculation to ensure each thread generates unique results, using the SM 440 to execute the program and perform calculations, shared memory/L1 cache 570 to communicate between threads, and the LSU 554 to read and write global memory through the shared memory/L1 cache 570 and the memory partition unit 380. When configured for general purpose parallel computation, the SM 440 can also write commands that the scheduler unit 320 can use to launch new work on the DPCs 420.

The PPU 300 may be included in a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, and the like. In an embodiment, the PPU 300 is embodied on a single semiconductor substrate. In another embodiment, the PPU 300 is included in a system-on-a-chip (SoC) along with one or more other devices such as additional PPUs 300, the memory 204, a reduced instruction set computer (RISC) CPU, a memory management unit (MMU), a digital-to-analog converter (DAC), and the like.

In an embodiment, the PPU 300 may be included on a graphics card that includes one or more memory devices 304. The graphics card may be configured to interface with a PCIe slot on a motherboard of a desktop computer. In yet another embodiment, the PPU 300 may be an integrated graphics processing unit (iGPU) or parallel processor included in the chipset of the motherboard.

Exemplary Computing System

Figure 5B:
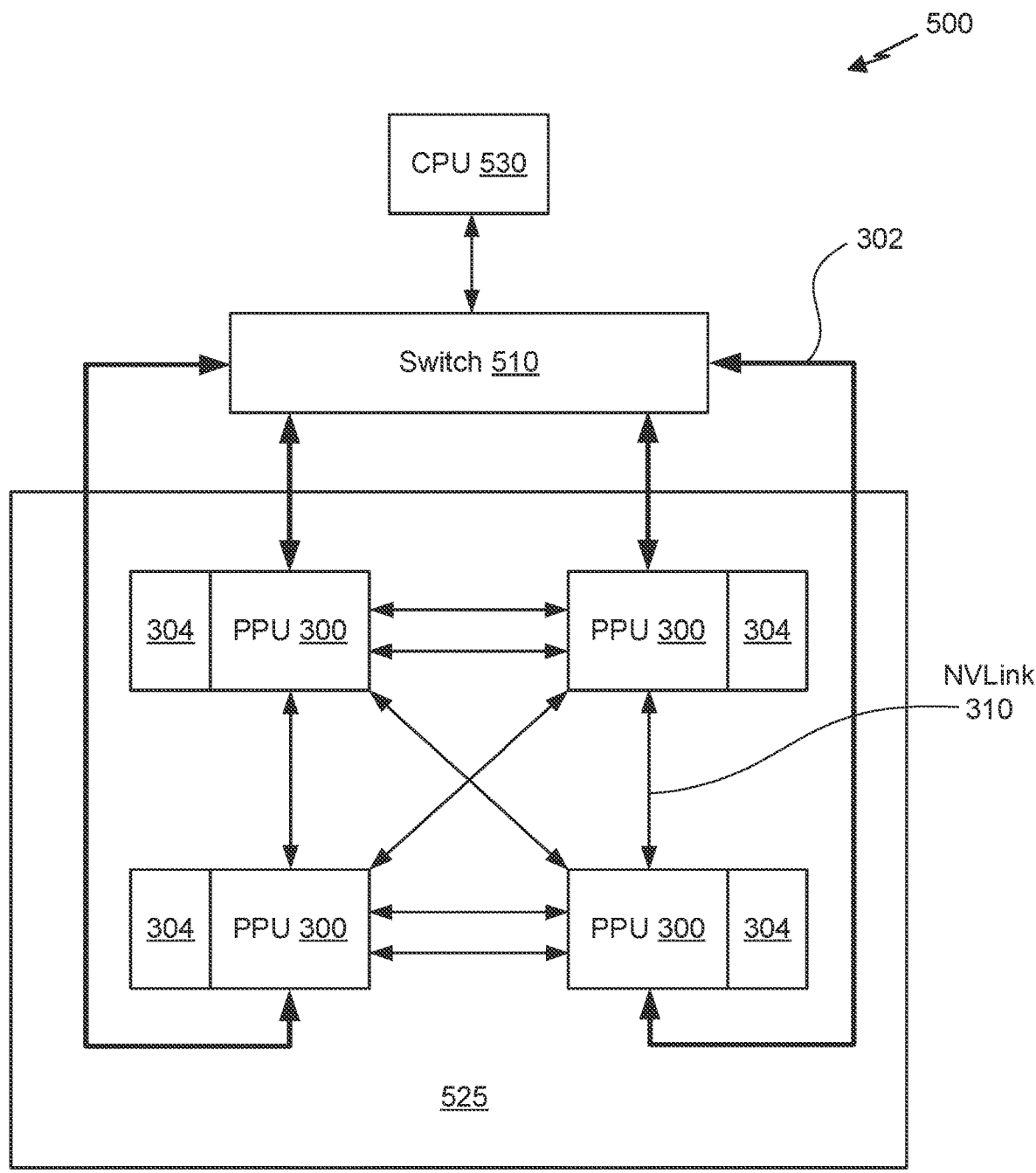
FIG. 5B is a conceptual diagram of a processing system implemented using the PPU of FIG. 3, in accordance with an embodiment.

Systems with multiple GPUs and CPUs are used in a variety of industries as developers expose and leverage more parallelism in applications such as artificial intelligence computing. High-performance GPU-accelerated systems with tens to many thousands of compute nodes are deployed in data centers, research facilities, and supercomputers to solve ever larger problems. As the number of processing devices within the high-performance systems increases, the communication and data transfer mechanisms need to scale to support the increased FIG. 5B is a conceptual diagram of a processing system 500 implemented using the PPU 300 of FIG. 3, in accordance with an embodiment. The processing system 500 may be configured to implement the method 110 shown in FIG. 1A. The processing system 500 includes a CPU 530, switch 510, and multiple PPUs 300 each and respective memories 304. The NVLink 310 provides high-speed communication links between each of the PPUs 300. Although a particular number of NVLink 310 and interconnect 302 connections are illustrated in FIG. 5B, the number of connections to each PPU 300 and the CPU 530 may vary. The switch 510 interfaces between the interconnect 302 and the CPU 530. The PPUs 300, memories 304, and NVLinks 310 may be situated on a single semiconductor platform to form a parallel processing module 525. In an embodiment, the switch 510 supports two or more protocols to interface between various different connections and/or links.

In another embodiment (not shown), the NVLink 310 provides one or more high-speed communication links between each of the PPUs 300 and the CPU 530 and the switch 510 interfaces between the interconnect 302 and each of the PPUs 300. The PPUs 300, memories 304, and interconnect 302 may be situated on a single semiconductor platform to form a parallel processing module 525. In yet another embodiment (not shown), the interconnect 302 provides one or more communication links between each of the PPUs 300 and the CPU 530 and the switch 510 interfaces between each of the PPUs 300 using the NVLink 310 to provide one or more high-speed communication links between the PPUs 300. In another embodiment (not shown), the NVLink 310 provides one or more high-speed communication links between the PPUs 300 and the CPU 530 through the switch 510. In yet another embodiment (not shown), the interconnect 302 provides one or more communication links between each of the PPUs 300 directly. One or more of the NVLink 310 high-speed communication links may be implemented as a physical NVLink interconnect or either an on-chip or on-die interconnect using the same protocol as the NVLink 310.

In the context of the present description, a single semiconductor platform may refer to a sole unitary semiconductor-based integrated circuit fabricated on a die or chip. It should be noted that the term single semiconductor platform may also refer to multi-chip modules with increased connectivity which simulate on-chip operation and make substantial improvements over utilizing a conventional bus implementation. Of course, the various circuits or devices may also be situated separately or in various combinations of semiconductor platforms per the desires of the user. Alternately, the parallel processing module 525 may be implemented as a circuit board substrate and each of the PPUs 300 and/or memories 304 may be packaged devices. In an embodiment, the CPU 530, switch 510, and the parallel processing module 525 are situated on a single semiconductor platform.

In an embodiment, the signaling rate of each NVLink 310 is 20 to 25 Gigabits/second and each PPU 300 includes six NVLink 310 interfaces (as shown in FIG. 5B, five NVLink 310 interfaces are included for each PPU 300). Each NVLink 310 provides a data transfer rate of 25 Gigabytes/second in each direction, with six links providing 300 Gigabytes/second. The NVLinks 310 can be used exclusively for PPU-to-PPU communication as shown in FIG. 5B, or some combination of PPU-to-PPU and PPU-to-CPU, when the CPU 530 also includes one or more NVLink 310 interfaces.

In an embodiment, the NVLink 310 allows direct load/store/atomic access from the CPU 530 to each PPU's 300 memory 304. In an embodiment, the NVLink 310 supports coherency operations, allowing data read from the memories 304 to be stored in the cache hierarchy of the CPU 530, reducing cache access latency for the CPU 530. In an embodiment, the NVLink 310 includes support for Address Translation Services (ATS), allowing the PPU 300 to directly access page tables within the CPU 530. One or more of the NVLinks 310 may also be configured to operate in a low-power mode.

Figure 5C:
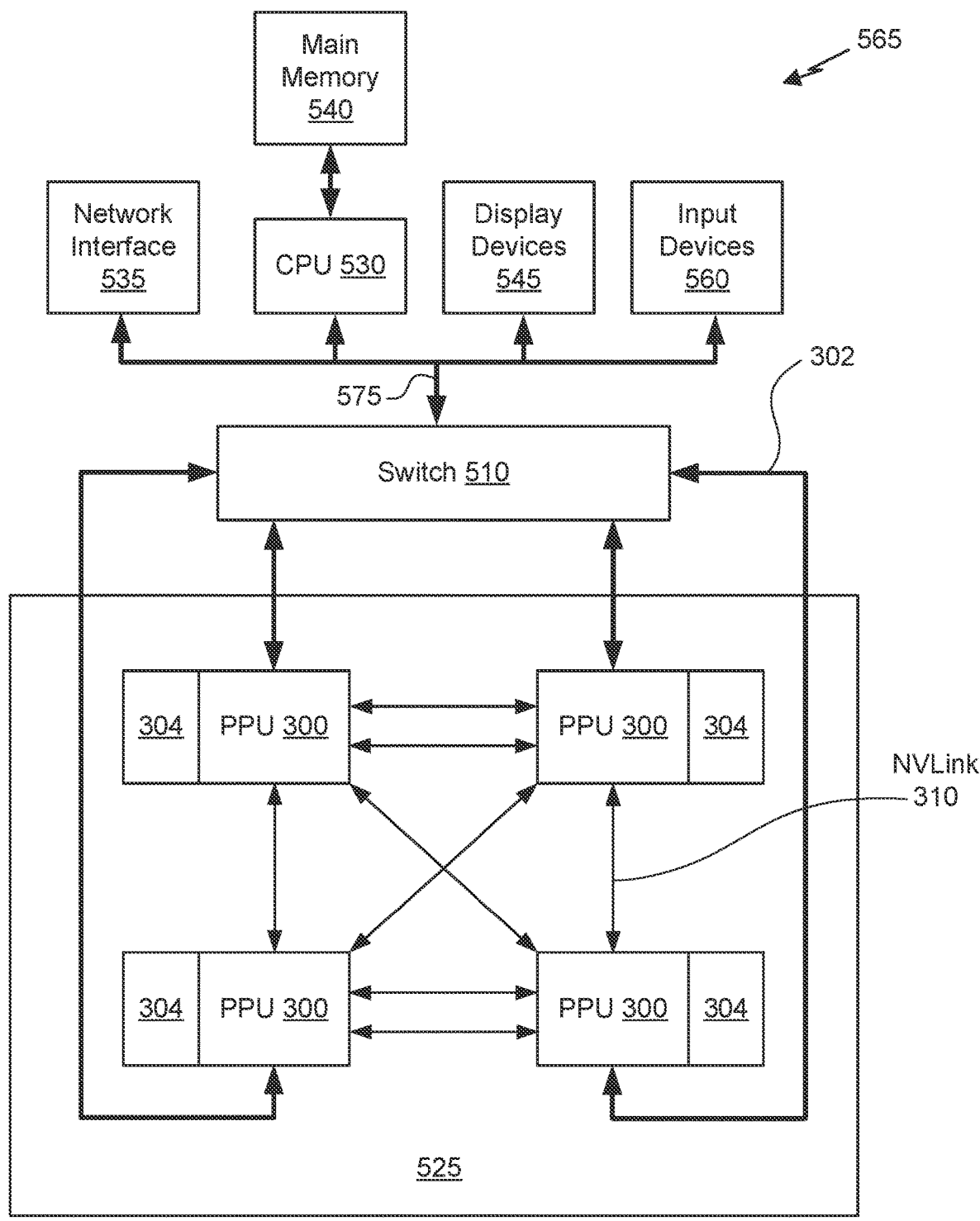
FIG. 5C illustrates an exemplary system in which the various architecture and/or functionality of the various previous embodiments may be implemented.

FIG. 5C illustrates an exemplary system 565 in which the various architecture and/or functionality of the various previous embodiments may be implemented. The exemplary system 565 may be configured to implement the method 110 shown in FIG. 1A.

As shown, a system 565 is provided including at least one central processing unit 530 that is connected to a communication bus 575. The communication bus 575 may be implemented using any suitable protocol, such as PCI (Peripheral Component Interconnect), PCI-Express, AGP (Accelerated Graphics Port), HyperTransport, or any other bus or point-to-point communication protocol(s). The system 565 also includes a main memory 540. Control logic (software) and data are stored in the main memory 540 which may take the form of random access memory (RAM).

The system 565 also includes input devices 560, the parallel processing system 525, and display devices 545, i.e. a conventional CRT (cathode ray tube), LCD (liquid crystal display), LED (light emitting diode), plasma display or the like. User input may be received from the input devices 560, e.g., keyboard, mouse, touchpad, microphone, and the like. Each of the foregoing modules and/or devices may even be situated on a single semiconductor platform to form the system 565. Alternately, the various modules may also be situated separately or in various combinations of semiconductor platforms per the desires of the user.

Further, the system 565 may be coupled to a network (e.g., a telecommunications network, local area network (LAN), wireless network, wide area network (WAN) such as the Internet, peer-to-peer network, cable network, or the like) through a network interface 535 for communication purposes.

The system 565 may also include a secondary storage (not shown). The secondary storage 610 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 540 and/or the secondary storage. Such computer programs, when executed, enable the system 565 to perform various functions. The memory 540, the storage, and/or any other storage are possible examples of computer-readable media.

The architecture and/or functionality of the various previous figures may be implemented in the context of a general computer system, a circuit board system, a game console system dedicated for entertainment purposes, an application-specific system, and/or any other desired system. For example, the system 565 may take the form of a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, a mobile phone device, a television, workstation, game consoles, embedded system, and/or any other type of logic.

Graphics Processing Pipeline

In an embodiment, the PPU 300 comprises a graphics processing unit (GPU). The PPU 300 is configured to receive commands that specify shader programs for processing graphics data. Graphics data may be defined as a set of primitives such as points, lines, triangles, quads, triangle strips, and the like. Typically, a primitive includes data that specifies a number of vertices for the primitive (e.g., in a model-space coordinate system) as well as attributes associated with each vertex of the primitive. The PPU 300 can be configured to process the graphics primitives to generate a frame buffer (i.e., pixel data for each of the pixels of the display).

An application writes model data for a scene (i.e., a collection of vertices and attributes) to a memory such as a system memory or memory 304. The model data defines each of the objects that may be visible on a display. The application then makes an API call to the driver kernel that requests the model data to be rendered and displayed. The driver kernel reads the model data and writes commands to the one or more streams to perform operations to process the model data. The commands may reference different shader programs to be implemented on the SMs 440 of the PPU 300 including one or more of a vertex shader, hull shader, domain shader, geometry shader, and a pixel shader. For example, one or more of the SMs 440 may be configured to execute a vertex shader program that processes a number of vertices defined by the model data. In an embodiment, the different SMs 440 may be configured to execute different shader programs concurrently. For example, a first subset of SMs 440 may be configured to execute a vertex shader program while a second subset of SMs 440 may be configured to execute a pixel shader program. The first subset of SMs 440 processes vertex data to produce processed vertex data and writes the processed vertex data to the L2 cache 460 and/or the memory 304. After the processed vertex data is rasterized (i.e., transformed from three-dimensional data into two-dimensional data in screen space) to produce fragment data, the second subset of SMs 440 executes a pixel shader to produce processed fragment data, which is then blended with other processed fragment data and written to the frame buffer in memory 304. The vertex shader program and pixel shader program may execute concurrently, processing different data from the same scene in a pipelined fashion until all of the model data for the scene has been rendered to the frame buffer. Then, the contents of the frame buffer are transmitted to a display controller for display on a display device.

Figure 6:
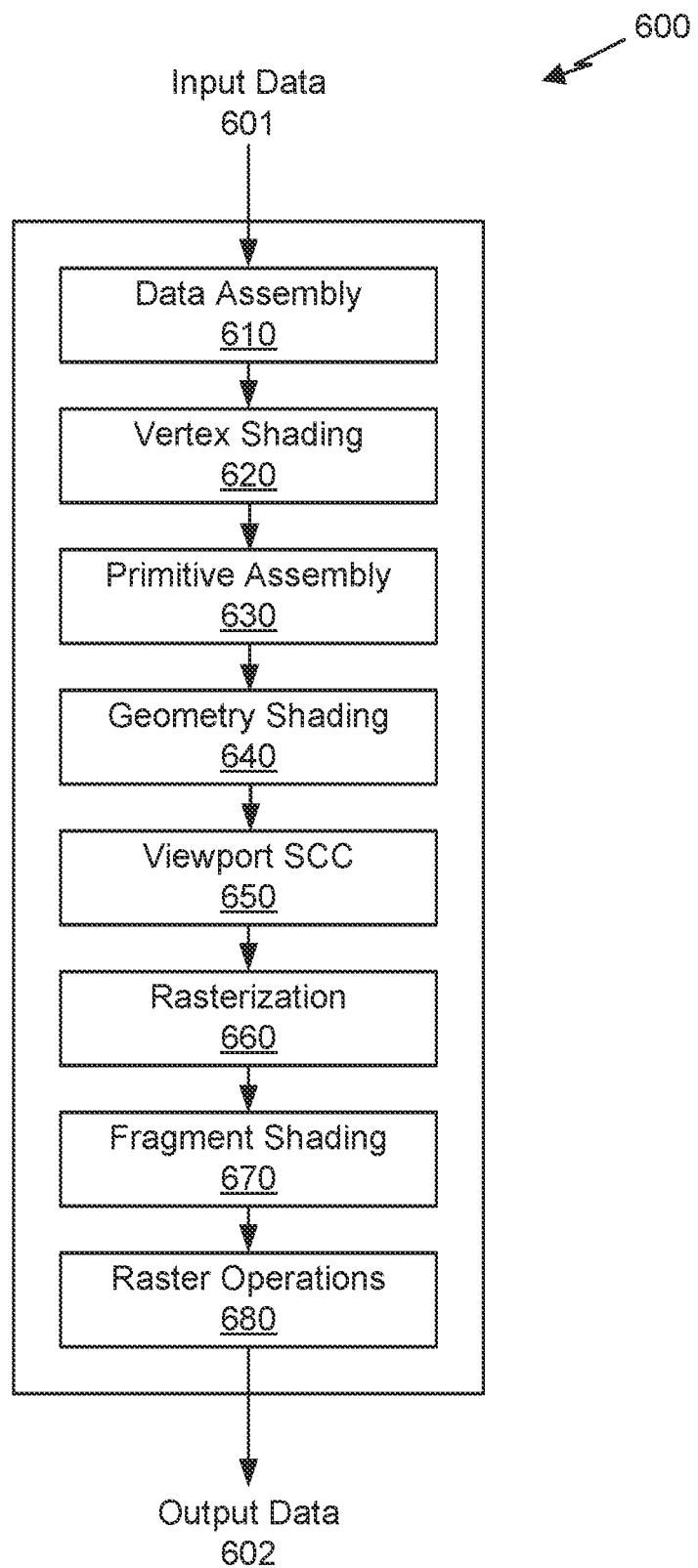
FIG. 6 is a conceptual diagram of a graphics processing pipeline implemented by the PPU of FIG. 3, in accordance with an embodiment.

FIG. 6 is a conceptual diagram of a graphics processing pipeline 600 implemented by the PPU 300 of FIG. 3, in accordance with an embodiment. The graphics processing pipeline 600 is an abstract flow diagram of the processing steps implemented to generate 2D computer-generated images from 3D geometry data. As is well-known, pipeline architectures may perform long latency operations more efficiently by splitting up the operation into a plurality of stages, where the output of each stage is coupled to the input of the next successive stage. Thus, the graphics processing pipeline 600 receives input data 601 that is transmitted from one stage to the next stage of the graphics processing pipeline 600 to generate output data 602. In an embodiment, the graphics processing pipeline 600 may represent a graphics processing pipeline defined by the OpenGL® API. As an option, the graphics processing pipeline 600 may be implemented in the context of the functionality and architecture of the previous Figures and/or any subsequent Figure(s).

As shown in FIG. 6, the graphics processing pipeline 600 comprises a pipeline architecture that includes a number of stages. The stages include, but are not limited to, a data assembly stage 610, a vertex shading stage 620, a primitive assembly stage 630, a geometry shading stage 640, a viewport scale, cull, and clip (SCC) stage 650, a rasterization stage 660, a fragment shading stage 670, and a raster operations stage 680. In an embodiment, the input data 601 comprises commands that configure the processing units to implement the stages of the graphics processing pipeline 600 and geometric primitives (e.g., points, lines, triangles, quads, triangle strips or fans, etc.) to be processed by the stages. The output data 602 may comprise pixel data (i.e., color data) that is copied into a frame buffer or other type of surface data structure in a memory.

The data assembly stage 610 receives the input data 601 that specifies vertex data for high-order surfaces, primitives, or the like. The data assembly stage 610 collects the vertex data in a temporary storage or queue, such as by receiving a command from the host processor that includes a pointer to a buffer in memory and reading the vertex data from the buffer. The vertex data is then transmitted to the vertex shading stage 620 for processing.

The vertex shading stage 620 processes vertex data by performing a set of operations (i.e., a vertex shader or a program) once for each of the vertices. Vertices may be, e.g., specified as a 4-coordinate vector (i.e., <x, y, z, w>) associated with one or more vertex attributes (e.g., color, texture coordinates, surface normal, etc.). The vertex shading stage 620 may manipulate individual vertex attributes such as position, color, texture coordinates, and the like. In other words, the vertex shading stage 620 performs operations on the vertex coordinates or other vertex attributes associated with a vertex. Such operations commonly including lighting operations (i.e., modifying color attributes for a vertex) and transformation operations (i.e., modifying the coordinate space for a vertex). For example, vertices may be specified using coordinates in an object-coordinate space, which are transformed by multiplying the coordinates by a matrix that translates the coordinates from the object-coordinate space into a world space or a normalized-device-coordinate (NCD) space. The vertex shading stage 620 generates transformed vertex data that is transmitted to the primitive assembly stage 630.

The primitive assembly stage 630 collects vertices output by the vertex shading stage 620 and groups the vertices into geometric primitives for processing by the geometry shading stage 640. For example, the primitive assembly stage 630 may be configured to group every three consecutive vertices as a geometric primitive (i.e., a triangle) for transmission to the geometry shading stage 640. In some embodiments, specific vertices may be reused for consecutive geometric primitives (e.g., two consecutive triangles in a triangle strip may share two vertices). The primitive assembly stage 630 transmits geometric primitives (i.e., a collection of associated vertices) to the geometry shading stage 640.

The geometry shading stage 640 processes geometric primitives by performing a set of operations (i.e., a geometry shader or program) on the geometric primitives. Tessellation operations may generate one or more geometric primitives from each geometric primitive. In other words, the geometry shading stage 640 may subdivide each geometric primitive into a finer mesh of two or more geometric primitives for processing by the rest of the graphics processing pipeline 600. The geometry shading stage 640 transmits geometric primitives to the viewport SCC stage 650.

In an embodiment, the graphics processing pipeline 600 may operate within a streaming multiprocessor and the vertex shading stage 620, the primitive assembly stage 630, the geometry shading stage 640, the fragment shading stage 670, and/or hardware/software associated therewith, may sequentially perform processing operations. Once the sequential processing operations are complete, in an embodiment, the viewport SCC stage 650 may utilize the data. In an embodiment, primitive data processed by one or more of the stages in the graphics processing pipeline 600 may be written to a cache (e.g. L1 cache, a vertex cache, etc.). In this case, in an embodiment, the viewport SCC stage 650 may access the data in the cache. In an embodiment, the viewport SCC stage 650 and the rasterization stage 660 are implemented as fixed function circuitry.

The viewport SCC stage 650 performs viewport scaling, culling, and clipping of the geometric primitives. Each surface being rendered to is associated with an abstract camera position. The camera position represents a location of a viewer looking at the scene and defines a viewing frustum that encloses the objects of the scene. The viewing frustum may include a viewing plane, a rear plane, and four clipping planes. Any geometric primitive entirely outside of the viewing frustum may be culled (i.e., discarded) because the geometric primitive will not contribute to the final rendered scene. Any geometric primitive that is partially inside the viewing frustum and partially outside the viewing frustum may be clipped (i.e., transformed into a new geometric primitive that is enclosed within the viewing frustum. Furthermore, geometric primitives may each be scaled based on a depth of the viewing frustum. All potentially visible geometric primitives are then transmitted to the rasterization stage 660.

The rasterization stage 660 converts the 3D geometric primitives into 2D fragments (e.g. capable of being utilized for display, etc.). The rasterization stage 660 may be configured to utilize the vertices of the geometric primitives to setup a set of plane equations from which various attributes can be interpolated. The rasterization stage 660 may also compute a coverage mask for a plurality of pixels that indicates whether one or more sample locations for the pixel intercept the geometric primitive. In an embodiment, z-testing may also be performed to determine if the geometric primitive is occluded by other geometric primitives that have already been rasterized. The rasterization stage 660 generates fragment data (i.e., interpolated vertex attributes associated with a particular sample location for each covered pixel) that are transmitted to the fragment shading stage 670.

The fragment shading stage 670 processes fragment data by performing a set of operations (i.e., a fragment shader or a program) on each of the fragments. The fragment shading stage 670 may generate pixel data (i.e., color values) for the fragment such as by performing lighting operations or sampling texture maps using interpolated texture coordinates for the fragment. The fragment shading stage 670 generates pixel data that is transmitted to the raster operations stage 680.

The raster operations stage 680 may perform various operations on the pixel data such as performing alpha tests, stencil tests, and blending the pixel data with other pixel data corresponding to other fragments associated with the pixel. When the raster operations stage 680 has finished processing the pixel data (i.e., the output data 602), the pixel data may be written to a render target such as a frame buffer, a color buffer, or the like.

It will be appreciated that one or more additional stages may be included in the graphics processing pipeline 600 in addition to or in lieu of one or more of the stages described above. Various implementations of the abstract graphics processing pipeline may implement different stages. Furthermore, one or more of the stages described above may be excluded from the graphics processing pipeline in some embodiments (such as the geometry shading stage 640). Other types of graphics processing pipelines are contemplated as being within the scope of the present disclosure. Furthermore, any of the stages of the graphics processing pipeline 600 may be implemented by one or more dedicated hardware units within a graphics processor such as PPU 300. Other stages of the graphics processing pipeline 600 may be implemented by programmable hardware units such as the SM 440 of the PPU 300.

The graphics processing pipeline 600 may be implemented via an application executed by a host processor, such as a CPU. In an embodiment, a device driver may implement an application programming interface (API) that defines various functions that can be utilized by an application in order to generate graphical data for display. The device driver is a software program that includes a plurality of instructions that control the operation of the PPU 300. The API provides an abstraction for a programmer that lets a programmer utilize specialized graphics hardware, such as the PPU 300, to generate the graphical data without requiring the programmer to utilize the specific instruction set for the PPU 300. The application may include an API call that is routed to the device driver for the PPU 300. The device driver interprets the API call and performs various operations to respond to the API call. In some instances, the device driver may perform operations by executing instructions on the CPU. In other instances, the device driver may perform operations, at least in part, by launching operations on the PPU 300 utilizing an input/output interface between the CPU and the PPU 300. In an embodiment, the device driver is configured to implement the graphics processing pipeline 600 utilizing the hardware of the PPU 300.

Various programs may be executed within the PPU 300 in order to implement the various stages of the graphics processing pipeline 600. For example, the device driver may launch a kernel on the PPU 300 to perform the vertex shading stage 620 on one SM 440 (or multiple SMs 440). The device driver (or the initial kernel executed by the PPU 400) may also launch other kernels on the PPU 400 to perform other stages of the graphics processing pipeline 600, such as the geometry shading stage 640 and the fragment shading stage 670. In addition, some of the stages of the graphics processing pipeline 600 may be implemented on fixed unit hardware such as a rasterizer or a data assembler implemented within the PPU 400. It will be appreciated that results from one kernel may be processed by one or more intervening fixed function hardware units before being processed by a subsequent kernel on an SM 440.

While various embodiments have been described above, it should be understood that they have been presented by way of example only, and not limitation. Thus, the breadth and scope of the present application should not be limited by any of the above-described exemplary embodiments, but should be defined only in accordance with the following and later-submitted claims and their equivalents.

What is claimed is:

1. A processing unit, configured to:
halt execution of a multi-threaded program within a subsystem of the processing unit;
inject a state error within the subsystem at a specified data storage circuit comprising one of a flip-flop, a latch, or a random access memory (RAM) bit by:
configuring data storage circuits within the subsystem to form a scan chain having a scan input signal at the beginning of the scan chain and a scan output signal at the end of the scan chain, wherein each data storage circuit of the data storage circuits includes an initial data value;
configuring the data storage circuits to receive a scan clock signal;
synchronously enabling the scan clock signal;
shifting, synchronously with the scan clock signal, data stored in the data storage circuits along the scan chain through one complete traverse of the scan chain,
wherein the scan output signal is configured to loop back into the scan input signal, and
wherein an initial data value for the specified data storage circuit is inverted at the scan input signal during a corresponding clock count of the scan clock signal;
synchronously disabling the scan clock signal;
configuring the data storage circuits to receive a functional clock signal; and
configuring the data storage circuits to operate in a functional mode; and
resume execution of the multi-threaded program.

2. The processing unit of claim 1, wherein execution is halted in response to at least one of: an indication that asynchronous buffers configured to interface with the subsystem are inactive, an indication that a specified number of clock cycles have been counted, and an indication that a specified breakpoint instruction has been executed.

3. The processing unit of claim 1, wherein halting comprises synchronously disabling at least one functional clock signal for the subsystem, and wherein resuming comprises synchronously enabling the at least one functional clock signal for the subsystem.

4. The processing unit of claim 1, wherein to inject the state error within the subsystem at the RAM bit, the processing unit is configured to:
configure a RAM instance that includes the RAM bit, a RAM controller circuit configured to control access to the RAM instance, and data storage circuits within combinational influence of the RAM instance to receive the scan clock signal;

capture state bits from the data storage circuits while the scan clock signal is enabled;

cause the RAM controller circuit to perform a read-modify-write operation to invert the RAM bit; and restore the state bits into the data storage circuits before the scan clock signal is disabled.

5. The processing unit of claim 4, wherein to capture, the processing unit is configured to shift the state bits into a temporary memory circuit.

6. The processing unit of claim 5, wherein to restore, the processing unit is configured to shift the state bits from the temporary memory circuit into the data storage circuits.

7. The processing unit of claim 4, wherein the combinational influence of the RAM instance comprises storage circuits that sample and store output data from the RAM instance through a combinational logic path.

8. The processing unit of claim 1, wherein a crossbar circuit is coupled to the subsystem through an asynchronous interface, and configured to transmit data to the subsystem and receive data from the subsystem through the asynchronous interface.

9. The processing unit of claim 8, wherein the asynchronous interface comprises at least one asynchronous first-in-first-out buffer (FIFO), and execution is halted when the FIFO is inactive.

10. The processing unit of claim 1, wherein the processing unit comprises a graphics processing unit (GPU).

11. A method for injecting a state error in a processing unit, comprising:

halting, by the processing unit, execution of a multi-threaded program within a subsystem;

injecting, by the processing unit, the state error within the subsystem at a specified data storage circuit comprising one of a flip-flop, a latch, or a random access memory (RAM) bit by:

configuring data storage circuits within the subsystem to form a scan chain having a scan input signal at the beginning of the scan chain and a scan output signal at the end of the scan chain, wherein each data storage circuit of the data storage circuits includes an initial data value;

configuring the data storage circuits to receive a scan clock signal;

synchronously enabling the scan clock signal;

shifting, synchronously with the scan clock signal, data stored in the data storage circuits along the scan chain through one complete traverse of the scan chain, wherein the scan output signal is configured to loop back into the scan input signal, and wherein an initial data value for the specified data storage circuit is inverted at the scan input signal during a corresponding clock count of the scan clock signal;

synchronously disabling the scan clock signal;

configuring the data storage circuits to receive a functional clock signal; and configuring the data storage circuits to operate in a functional mode; and resuming execution, by the processing unit, of the multi-threaded program.

12. The method of claim 11, wherein execution is halted in response to at least one of: an indication that asynchronous buffers configured to interface with the subsystem are inactive, an indication that a specified number of clock cycles have been counted, and an indication that a specified breakpoint instruction has been executed.

13. The method of claim 11, wherein halting comprises synchronously disabling at least one functional clock signal for the subsystem, and wherein resuming comprises synchronously enabling the at least one functional clock signal for the subsystem.

14. The method of claim 11, wherein injecting the state error comprises:

configuring a RAM instance that includes the RAM bit, a RAM controller circuit configured to control access to the RAM instance, and data storage circuits within combinational influence of the RAM instance to receive the scan clock signal;

capturing state bits from the data storage circuits while the scan clock signal is enabled;

causing the RAM controller circuit to perform a read-modify-write operation to invert the specified RAM bit; and restoring the state bits into the data storage circuits before the scan clock signal is disabled.

15. The method claim 14, wherein capturing comprises shifting the state bits into a temporary memory circuit.

16. The method of claim 15, wherein restoring comprises shifting the state bits from the temporary memory circuit into the data storage circuits.

17. The method unit of claim 14, wherein the combinational influence of the RAM instance comprises storage circuits that sample and store output data from the RAM instance through a combinational logic path.

18. A system, comprising:

a processing unit configured to:

halt execution of a multi-threaded program within a subsystem of the processing unit;

inject a state error within the subsystem at a specified data storage circuit comprising one of a flip-flop, a latch, or a random access memory (RAM) bit by:

configuring data storage circuits within the subsystem to form a scan chain having a scan input signal at the beginning of the scan chain and a scan output signal at the end of the scan chain, wherein each data storage circuit of the data storage circuits includes an initial data value;

configuring the data storage circuits to receive a scan clock signal;

synchronously enabling the scan clock signal;

shifting, synchronously with the scan clock signal, data stored in the data storage circuits along the scan chain through one complete traverse of the scan chain, wherein the scan output signal is configured to loop back into the scan input signal, and wherein an initial data value for the specified data storage circuit is inverted at the scan input signal during a corresponding clock count of the scan clock signal;

synchronously disabling the scan clock signal;

configuring the data storage circuits to receive a functional clock signal; and configuring the data storage circuits to operate in a functional mode; and resume execution of the multi-threaded program.

19. The system of claim 18, wherein execution is halted in response to at least one of: an indication that asynchronous buffers configured to interface with the subsystem are inactive, an indication that a specified number of clock cycles have been counted, and an indication that a specified breakpoint instruction has been executed.

20. The system of claim 18, wherein a crossbar circuit is coupled to the subsystem through an asynchronous interface, and configured to transmit data to the subsystem and receive data from the subsystem through the asynchronous interface.

* * * * *